(«12») United States Patent
Hattori et al.

(10) Patent No.: US 10,319,531 B2
(45) Date of Patent: *Jun. 11, 2019

(54) COMPOSITE ELECTRONIC COMPONENT AND RESISTOR DEVICE

(71) Applicant: Murata Manufacturing Co., Ltd., Nagaokakyo-shi, Kyoto-fu (JP)

(72) Inventors: Kazuo Hattori, Nagaokakyo (JP); Isamu Fujimoto, Nagaokakyo (JP); Shinichiro Kuroiwa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/697,503

(22) Filed: Sep. 7, 2017

(65) Prior Publication Data

US 2018/0075974 A1 Mar. 15, 2018

(30) Foreign Application Priority Data

Sep. 9, 2016 (JP) .................. 2016-176992

(51) Int. Cl.
*H01G 4/30* (2006.01)
*H01G 4/40* (2006.01)
(Continued)

(52) U.S. Cl.
CPC .............. *H01G 4/40* (2013.01); *H01G 4/385* (2013.01); *H01L 21/84* (2013.01)

(58) Field of Classification Search
CPC .. H01G 4/30; H01G 4/38; H01G 4/40; H01G 4/385; H01G 4/248; H01G 4/232; H01G 4/005

See application file for complete search history.

(56) References Cited

U.S. PATENT DOCUMENTS

2012/0236462 A1 9/2012 Haruki et al.
2016/0133386 A1 5/2016 Park et al.
(Continued)

FOREIGN PATENT DOCUMENTS

JP 6-283301 A 10/1994
JP 08-064458 A 3/1996
(Continued)

OTHER PUBLICATIONS

Official Communication issued in Korean Patent Application No. 10-2017-0112369, dated Dec. 28, 2018.
(Continued)

*Primary Examiner* — Nguyen T Ha
(74) *Attorney, Agent, or Firm* — Keating & Bennett, LLP

(57) ABSTRACT

A composite electronic component includes a capacitor device and a resistor device stacked together in a height direction. The capacitor device includes a capacitor body and first and second external electrodes. The resistor device includes a base, a resistive element, first and second upper surface conductors, first and second lower surface conductors, a first connection conductor, and a second connection conductor. The upper surface of the base of the resistor device faces the lower surface of the capacitor body of the capacitor device, the first upper surface conductor is electrically connected to the first external electrode, and the second upper surface conductor is electrically connected to the second external electrode.

20 Claims, 22 Drawing Sheets

(51) Int. Cl.
*H01G 4/38* (2006.01)
*H01L 21/84* (2006.01)

(56) References Cited

U.S. PATENT DOCUMENTS

2017/0278638 A1* 9/2017 Hattori .................... H01G 2/06
2018/0075975 A1* 3/2018 Hattori .................... H01G 4/40

FOREIGN PATENT DOCUMENTS

| | | |
|---|---|---|
| JP | 08-330174 A | 12/1996 |
| JP | 2000-164456 A | 6/2000 |
| JP | 2001-338838 A | 12/2001 |
| JP | 2014-187315 A | 10/2014 |
| JP | 2014-187322 A | 10/2014 |
| KR | 10-2010-0048044 A | 5/2010 |
| KR | 10-2012-0106599 A | 9/2012 |
| KR | 10-2016-0055424 A | 5/2016 |

OTHER PUBLICATIONS

Hattori, K. et al.; "Composite Electronic Component and Resistor Device"; U.S. Appl. No. 15/697,509, filed Sep. 7, 2017.
Official Communication issued in Korean Patent Application No. 10-2017-0112369, dated Jun. 21, 2018.

* cited by examiner

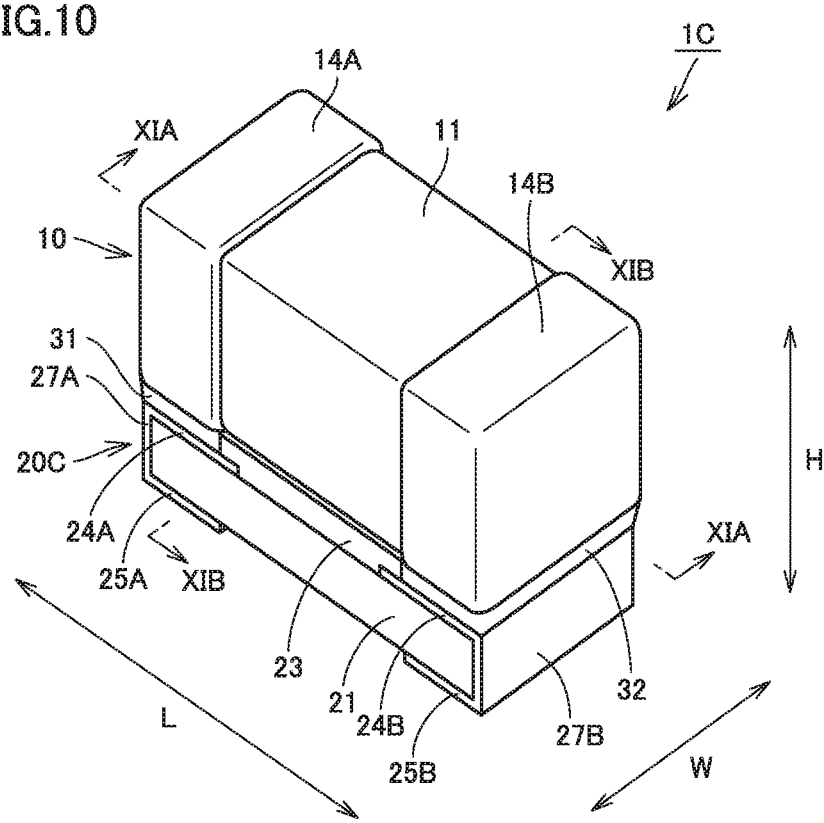

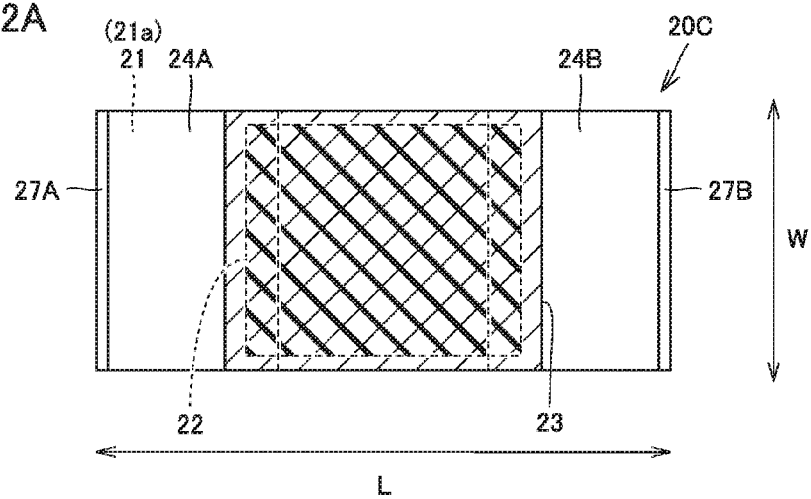
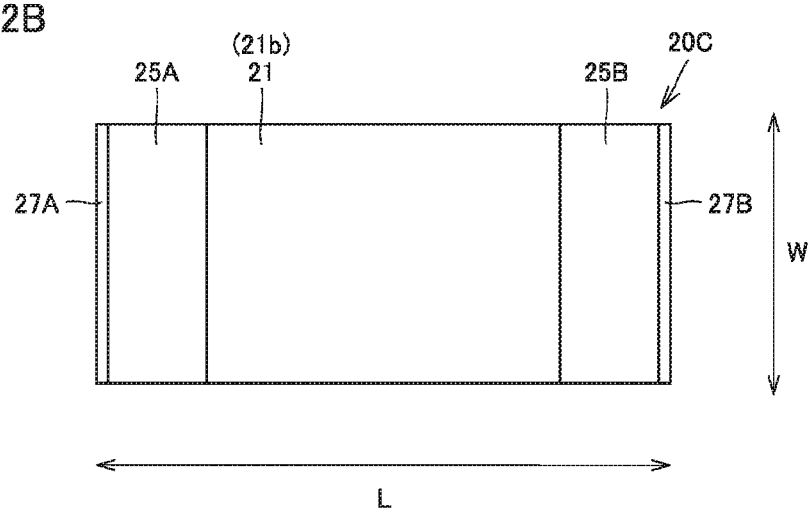
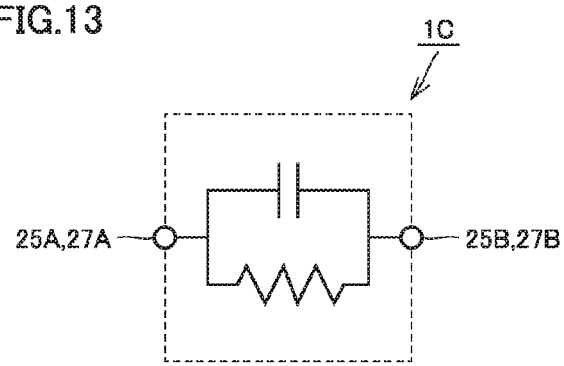

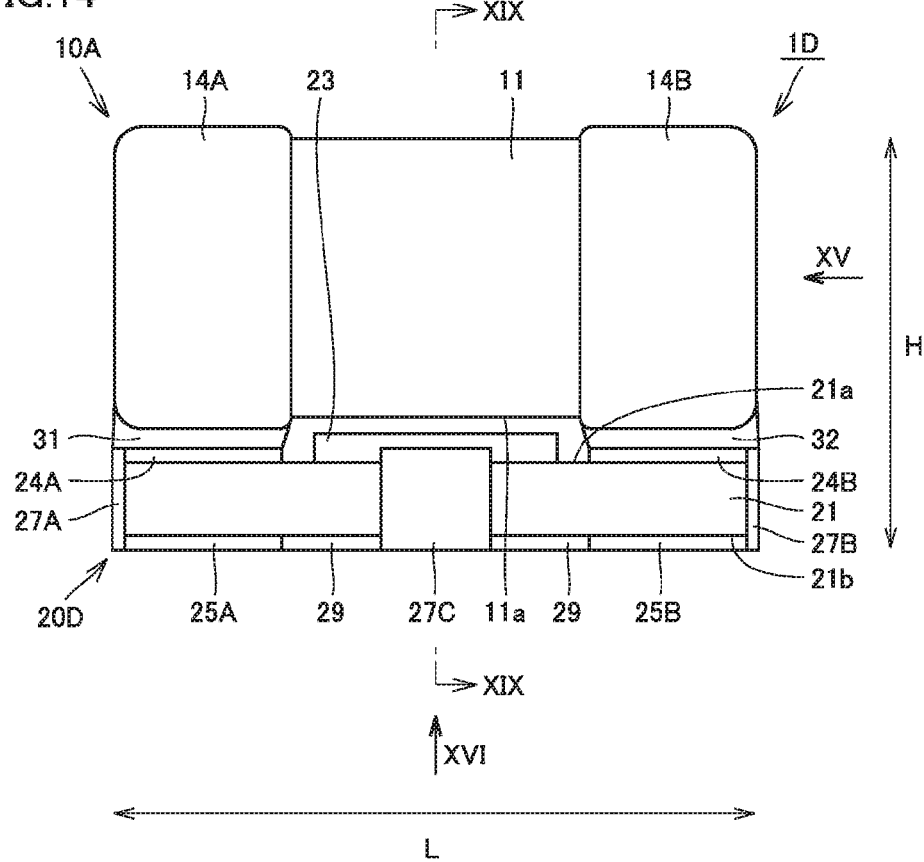

COMPOSITE ELECTRONIC COMPONENT AND RESISTOR DEVICE

CROSS REFERENCE TO RELATED APPLICATIONS

This application claims the benefit of priority to Japanese Patent Application No. 2016-176992 filed on Sep. 9, 2016. The entire contents of this application are hereby incorporated herein by reference.

BACKGROUND OF THE INVENTION

1. Field of the Invention

The present invention relates to a composite electronic component including a resistor device and a capacitor device, and also relates to a resistor device included in a composite electronic component and structured to be used in the composite electronic component.

2. Description of the Related Art

A variety of composite electronic components have been proposed each including a resistor element (R) and a capacitor element (C) for achieving a higher degree of integration of electronic elements disposed on a circuit board.

For example, Japanese Patent Laying-Open No. 2001-338838 discloses a composite electronic component including a chip-type capacitor including a capacitor body and a resistive element disposed on an external surface of the capacitor body, and the resistive element is connected to a pair of external electrodes disposed on the external surface of the capacitor body so that the resistor element and the capacitor element are electrically connected to each other.

Japanese Patent Laying-Open No. H06-283301 discloses a composite electronic component into which chip-type devices having a rectangular parallelepiped shape and identical in shape and dimensions are integrated. The chip-type devices are of two or more kinds selected from a group of chip-type resistors, chip-type thermistors, chip-type capacitors, and chip-type varistors, for example. In this composite electronic component, the chip-type devices are laid on each other in the direction of the thickness of these devices, and a lead frame covers respective terminal electrodes of the devices together. The devices are thus integrated into the composite electronic component.

The composite electronic component disclosed in Japanese Patent Laying-Open No. 2001-338838 includes a resistive element formed directly on the surface of the capacitor body, which increases the difficulty in processing during manufacture. In addition, electrical characteristics of the resistive element are restricted by the size of the capacitor body as well as by the shape and the size, for example, of the pair of external electrodes disposed on the capacitor body. Consequently, the degree of freedom in designing the composite electronic component is significantly reduced.

As for the composite electronic component disclosed in Japanese Patent Laying-Open No. H06-283301, it is required to fabricate the different chip-type devices to be integrated, so that these chip-type devices are rectangular parallelepipeds that are identical in shape and dimensions. Due to this, electrical characteristics of each chip-type device are significantly restricted. Consequently, the degree of freedom in designing the composite electronic component is reduced as well.

The composite electronic components disclosed in Japanese Patent Laying-Open Nos. 2001-338838 and H06-283301 are both limited to the configuration in which the resistor element (R) and the capacitor element (C) are electrically connected in parallel, due to the inherent structures of the composite electronic components. Consequently, the degree of freedom in designing a circuit is significantly limited. Use of these composite electronic components is, therefore, limited to a specific circuit.

SUMMARY OF THE INVENTION

Preferred embodiments of the present invention provide composite electronic components in which a resistor element and a capacitor element each having desired electrical characteristics are able to be easily combined, which improves the degree of freedom in designing the composite electronic component.

A composite electronic component according to a preferred embodiment of the present invention includes a resistor device and a capacitor device mounted on the resistor device in a height direction. The resistor device includes an electrically insulating base including an upper surface and a lower surface opposite to each other in the height direction, a resistive element disposed on the base, a first upper surface conductor and a second upper surface conductor disposed on the upper surface of the base and separated from each other in a length direction perpendicular or substantially perpendicular to the height direction, a first lower surface conductor and a second lower surface conductor disposed on the lower surface of the base and separated from each other in the length direction, a first connection conductor connecting the first upper surface conductor to the first lower surface conductor, and a second connection conductor connecting the second upper surface conductor to the second lower surface conductor. The capacitor device includes a capacitor body including a lower surface crossing the height direction, and a first external electrode and a second external electrode disposed on an outer surface of the capacitor body and separated from each other in the length direction.

In a composite electronic component according to a preferred embodiment of the present invention, the upper surface of the base faces the lower surface of the capacitor body in the height direction, the first upper surface conductor is electrically connected to the first external electrode, and the second upper surface conductor is electrically connected to the second external electrode. The first connection conductor and the second connection conductor are each defined by only a conductor located on an outer peripheral surface of the base.

In a composite electronic device according to another preferred embodiment of the present invention, the resistive element is disposed on the upper surface of the base and located between the first upper surface conductor and the second upper surface conductor in the length direction. In this case, the resistor device preferably further includes a third upper surface conductor and a fourth upper surface conductor disposed on the upper surface of the base, located between the first upper surface conductor and the second upper surface conductor in the length direction, and separated from each other, a third lower surface conductor and a fourth lower surface conductor disposed on the lower surface of the base, located between the first lower surface conductor and the second lower surface conductor in the length direction, and separated from each other, a third connection conductor connecting the third upper surface conductor to the third lower surface conductor, and a fourth connection conductor connecting the fourth upper surface conductor to the fourth lower surface conductor. The third upper surface conductor and the fourth upper surface conductor may be connected to the resistive element. The third connection conductor and the fourth connection conductor are each defined by only a conductor located on the outer peripheral surface of the base.

In a composite electronic device according to another preferred embodiment of the present invention, the third upper surface conductor and the fourth upper surface conductor may be separated from each other in a width direction perpendicular or substantially perpendicular to the height direction and the length direction.

In a composite electronic device according to another preferred embodiment of the present invention, the resistive element is disposed on the upper surface of the base. In this case, the resistor device may further include a third upper surface conductor disposed on the upper surface of the base and located between the first upper surface conductor and the second upper surface conductor in the length direction, a third lower surface conductor disposed on the lower surface of the base and located between the first lower surface conductor and the second lower surface conductor in the length direction, and a third connection conductor connecting the third upper surface conductor to the third lower surface conductor, and the first upper surface conductor and the third upper surface conductor may be connected to the resistive element.

In a composite electronic device according to another preferred embodiment of the present invention, the resistive element is disposed on the upper surface of the base. In this case, the first upper surface conductor and the second upper surface conductor may be connected to the resistive element.

In a composite electronic device according to another preferred embodiment of the present invention, the resistor device further includes a protective film covering the resistive element.

In a composite electronic device according to another preferred embodiment of the present invention, a maximum height of the protective film from the upper surface of the base may be larger than respective maximum heights of the first upper surface conductor and the second upper surface conductor from the upper surface of the base.

In a composite electronic device according to another preferred embodiment of the present invention, the resistive element is disposed on the lower surface of the base and located between the first lower surface conductor and the second lower surface conductor in the length direction. In this case, the resistor device may further include a third lower surface conductor and a fourth lower surface conductor disposed on the lower surface of the base, located between the first lower surface conductor and the second lower surface conductor in the length direction, and separated from each other, and the third lower surface conductor and the fourth lower surface conductor may be connected to the resistive element.

In a composite electronic device according to another preferred embodiment of the present invention, preferably, the third lower surface conductor and the fourth lower surface conductor may be separated from each other in a width direction perpendicular or substantially perpendicular to the height direction and the length direction.

In a composite electronic device according to another preferred embodiment of the present invention, the resistor device further includes a protective film covering the resistive element.

In a composite electronic device according to another preferred embodiment of the present invention, the resistive element is embedded in the base and located between the first connection conductor and the second connection conductor in the length direction. In this case, the resistor device may further include a third upper surface conductor and a fourth upper surface conductor disposed on the upper surface of the base, located between the first upper surface conductor and the second upper surface conductor in the length direction, and separated from each other, a third lower surface conductor and a fourth lower surface conductor disposed on the lower surface of the base, located between the first lower surface conductor and the second lower surface conductor in the length direction, and separated from each other, a third connection conductor connecting the third upper surface conductor to the third lower surface conductor, and a fourth connection conductor connecting the fourth upper surface conductor to the fourth lower surface conductor, and the third and fourth connection conductors may be connected to the resistive element. The third connection conductor and the fourth connection conductor are each defined by only a conductor located on the outer peripheral surface of the base.

In a composite electronic device according to another preferred embodiment of the present invention, the capacitor body includes a plurality of internal electrode layers stacked together. One of a pair of internal electrode layers adjacent to each other among the plurality of internal electrode layers is electrically connected to one of the first external electrode and the second external electrode and the other of the pair of internal electrode layers is electrically connected to the other of the first external electrode and the second external electrode. A stacking direction in which the plurality of internal electrode layers are stacked together is perpendicular or substantially perpendicular to the height direction.

In a composite electronic device according to another preferred embodiment of the present invention, preferably, the capacitor device includes surfaces crossing the stacking direction in which the plurality of internal electrode layers are stacked, as seen in the length direction, and the surfaces of the capacitor device are each curved outward in a convex shape.

In a composite electronic device according to another preferred embodiment of the present invention, the capacitor device includes surfaces extending along the stacking direction in which the plurality of internal electrode layers are stacked, as seen in the length direction, and the surfaces of the capacitor device are each curved so that respective centers are recessed inward.

In a composite electronic device according to another preferred embodiment of the present invention, the first upper surface conductor and the first external electrode are connected to each other through a first joint member. The second upper surface conductor and the second external electrode are connected to each other through a second joint member.

In a composite electronic device according to another preferred embodiment of the present invention, the first joint member and the second joint member are each made of a conductive joint material.

In a composite electronic device according to another preferred embodiment of the present invention, a main component of the conductive joint material is Sn (tin).

In a composite electronic device according to another preferred embodiment of the present invention, the conductive joint material contains Sb (antimony) or Au (gold).

In a composite electronic device according to another preferred embodiment of the present invention, Ag (silver) and Cu (copper) are absent in the conductive joint material.

In a composite electronic device according to another preferred embodiment of the present invention, the conductive joint material has a melting point of about 237° C. or more, for example.

In a composite electronic device according to another preferred embodiment of the present invention, a resin film extending continuously on the capacitor device and the resistor device covers at least a portion of a surface of each of the first joint member and the second joint member.

In a composite electronic device according to another preferred embodiment of the present invention, the resin film covers a whole surface of each of the first joint member and the second joint member.

In a composite electronic device according to another preferred embodiment of the present invention, the first external electrode and the second external electrode each include an Sn (tin) plating layer and an Sn—Ni (nickel) layer covered by the Sn plating layer and containing an intermetallic compound of Sn and Ni. The Sn—Ni layer is exposed from at least a portion of each of the first external electrode and the second external electrode.

In a composite electronic device according to another preferred embodiment of the present invention, the Sn—Ni layer is exposed from vertices and edges of each of the first external electrode and the second external electrode.

In a composite electronic device according to another preferred embodiment of the present invention, the first external electrode and the second external electrode are each smaller in width than the capacitor body.

In a composite electronic device according to another preferred embodiment of the present invention, the resistor device is larger in width than the capacitor device.

In a composite electronic device according to another preferred embodiment of the present invention, the resistor device is larger in length than the capacitor device.

A resistor device according to a preferred embodiment of the present invention includes an electrically insulating base including an upper surface and a lower surface opposite to each other in a height direction, a resistive element disposed on the base, a first upper surface conductor and a second upper surface conductor disposed on the upper surface of the base and separated from each other in a length direction perpendicular or substantially perpendicular to the height direction, a first lower surface conductor and a second lower surface conductor disposed on the lower surface of the base and separated from each other in the length direction, a first connection conductor connecting the first upper surface conductor to the first lower surface conductor, a second connection conductor connecting the second upper surface conductor to the second lower surface conductor, a third upper surface conductor and a fourth upper surface conductor disposed on the upper surface of the base, located between the first upper surface conductor and the second upper surface conductor in the length direction, and separated from each other, a third lower surface conductor and a fourth lower surface conductor disposed on the lower surface of the base, located between the first lower surface conductor and the second lower surface conductor in the length direction, and separated from each other, a third connection conductor connecting the third upper surface conductor to the third lower surface conductor, and a fourth connection conductor connecting the fourth upper surface conductor to the fourth lower surface conductor. The resistive element is disposed on the upper surface of the base and located between the first upper surface conductor and the second upper surface conductor in the length direction. In the resistor device according to this preferred embodiment of the present invention, the third upper surface conductor and the fourth upper surface conductor are connected to the resistive element. The first connection conductor and the second connection conductor are each defined by only a conductor located on an outer peripheral surface of the base. The third connection conductor and the fourth connection conductor are each defined by only a conductor located on the outer peripheral surface of the base.

In a resistor device according to another preferred embodiment of the present invention, the third upper surface conductor and the fourth upper surface conductor are separated from each other in a width direction perpendicular or substantially perpendicular to the height direction and the length direction.

Preferably, the resistor device according to a preferred embodiment of the present invention further includes a protective film covering the resistive element.

In a resistor device according to another preferred embodiment of the present invention, a maximum height of the protective film from the upper surface of the base may be larger than respective maximum heights of the first upper surface conductor and the second upper surface conductor from the upper surface of the base.

A resistor device according to another preferred embodiment of the present invention includes an electrically insulating base including an upper surface and a lower surface opposite to each other in a height direction, a resistive element disposed on the base, a first upper surface conductor and a second upper surface conductor disposed on the upper surface of the base and separated from each other in a length direction perpendicular or substantially perpendicular to the height direction, a first lower surface conductor and a second lower surface conductor disposed on the lower surface of the base and separated from each other in the length direction, a first connection conductor connecting the first upper surface conductor to the first lower surface conductor, a second connection conductor connecting the second upper surface conductor to the second lower surface conductor; and a third lower surface conductor and a fourth lower surface conductor disposed on the lower surface of the base, located between the first lower surface conductor and the second lower surface conductor in the length direction, and separated from each other. The resistive element is disposed on the lower surface of the base and located between the first lower surface conductor and the second lower surface conductor in the length direction. The third lower surface conductor and the fourth lower surface conductor are connected to the resistive element. The first connection conductor and the second connection conductor are each defined by only a conductor located on an outer peripheral surface of the base.

In a resistor device according to another preferred embodiment of the present invention, the third lower surface conductor and the fourth lower surface conductor may be separated from each other in a width direction perpendicular to the height direction and the length direction.

A resistor device according to another preferred embodiment of the present invention may further include a protective film covering the resistive element.

A resistor device according to another preferred embodiment of the present invention includes an electrically insulating base including an upper surface and a lower surface opposite to each other in a height direction, a resistive element disposed on the base, a first upper surface conductor and a second upper surface conductor disposed on the upper surface of the base and separated from each other in a length direction perpendicular or substantially perpendicular to the height direction, a first lower surface conductor and a second lower surface conductor disposed on the lower surface of the base and separated from each other in the length direction, a first connection conductor connecting the first upper surface conductor to the first lower surface conductor, a second connection conductor connecting the second upper surface conductor to the second lower surface conductor, a third upper surface conductor and a fourth upper surface conductor disposed on the upper surface of the base, located between the first upper surface conductor and the second upper surface conductor in the length direction, and separated from each other, a third lower surface conductor and a fourth lower surface conductor disposed on the lower surface of the base, located between the first lower surface conductor and the second lower surface conductor in the length direction, and separated from each other, a third connection conductor connecting the third upper surface conductor to the third lower surface conductor, and a fourth connection conductor connecting the fourth upper surface conductor to the fourth lower surface conductor. The resistive element is embedded in the base and located between the first connection conductor and the second connection conductor in the length direction. In the resistor device according to this preferred embodiment of the present invention, the third connection conductor and the fourth connection conductor are connected to the resistive element. The first connection conductor and the second connection conductor are each defined by only a conductor located on an outer peripheral surface of the base. The third connection conductor and the fourth connection conductor are each defined by only a conductor located on the outer peripheral surface of the base.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 10 is a schematic perspective view of a composite electronic component in a second preferred embodiment of the present invention.

FIG. 12A is a top view of a resistor device shown in FIG. 10.

FIG. 12B is a bottom view of the resistor device shown in FIG. 10.

FIG. 13 is a diagram showing an equivalent circuit of the composite electronic component shown in FIG. 10.

FIG. 14 is a side view of a composite electronic component in a third preferred embodiment of the present invention.

DETAILED DESCRIPTION OF THE PREFERRED EMBODIMENTS

Figure 1:
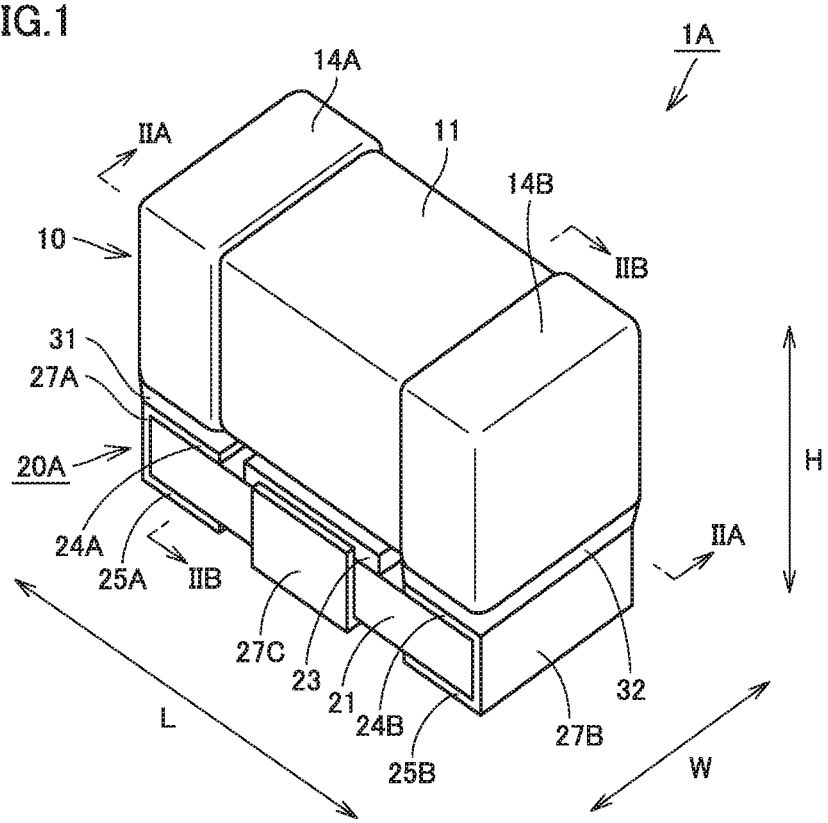
FIG. 1 is a schematic perspective view of a composite electronic component according to a first preferred embodiment of the present invention.

In the following, preferred embodiments of the present invention will be described in detail with reference to the drawings. Regarding the following preferred embodiments, the same or common structure and elements in the drawings are denoted by the same reference characters, and a description thereof will not be repeated.

First Preferred Embodiment

Figure 2A:
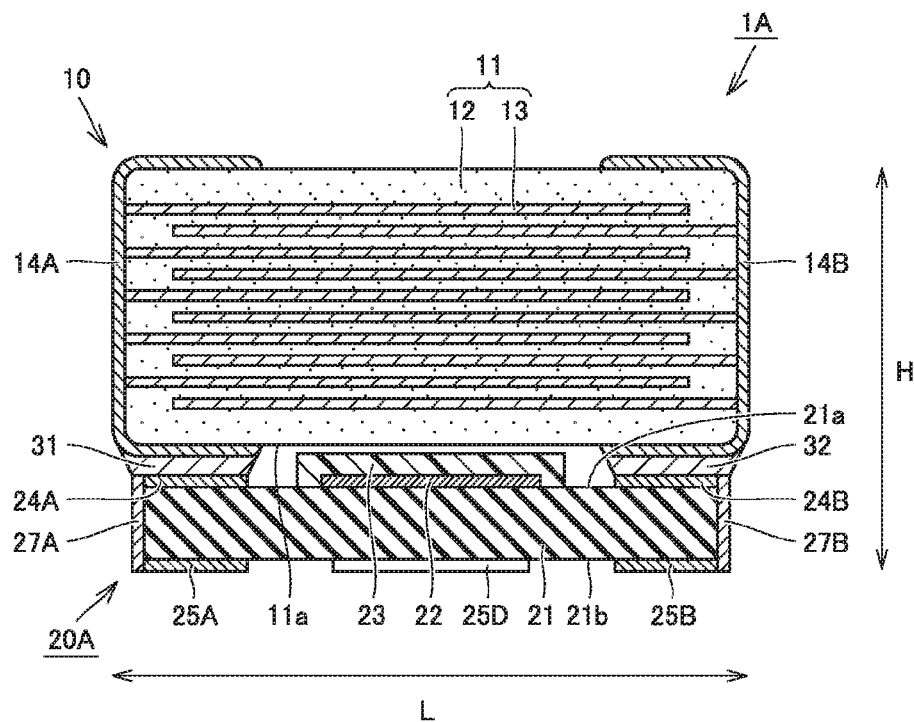
FIG. 2A is a schematic cross-sectional view along a line IIA-IIA shown in FIG. 1.
Figure 2B:
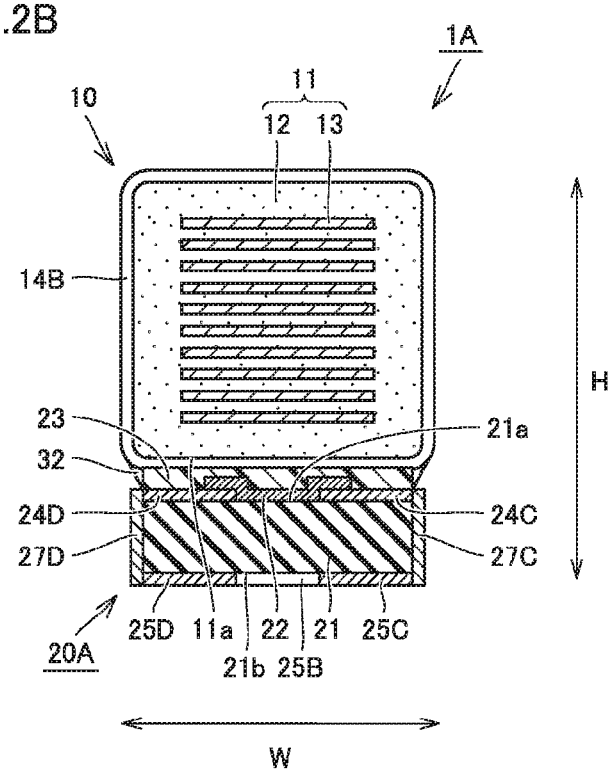
FIG. 2B is a schematic cross-sectional view along a line IIB-IIB shown in FIG. 1.
Figure 3A:
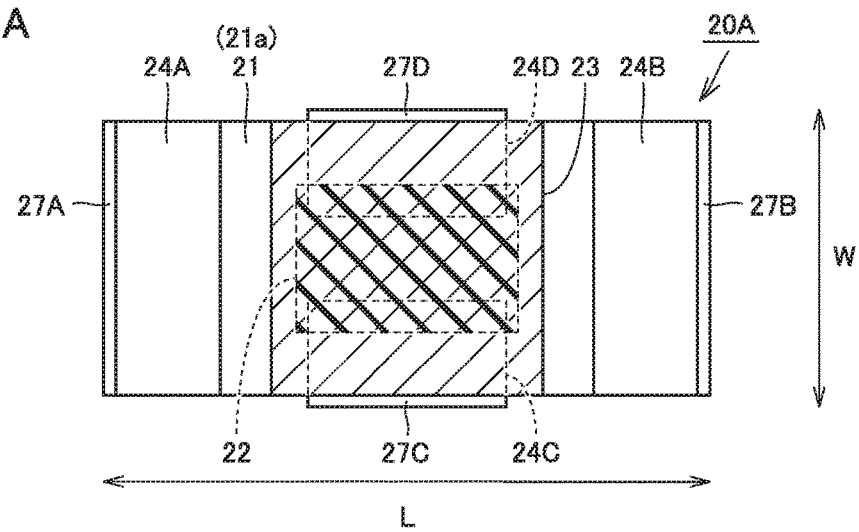
FIG. 3A is a top view of a resistor device shown in FIG. 1.
Figure 3B:
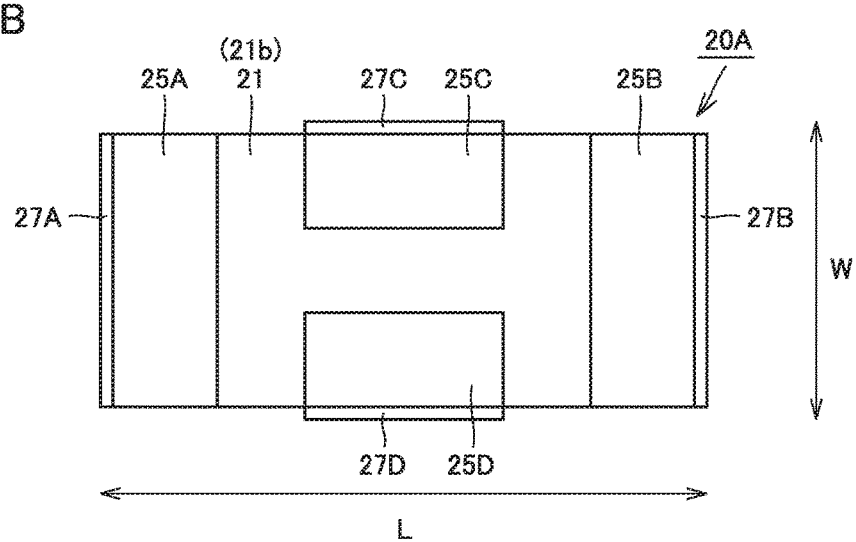
FIG. 3B is a bottom view of the resistor device shown in FIG. 1.
Figure 4:
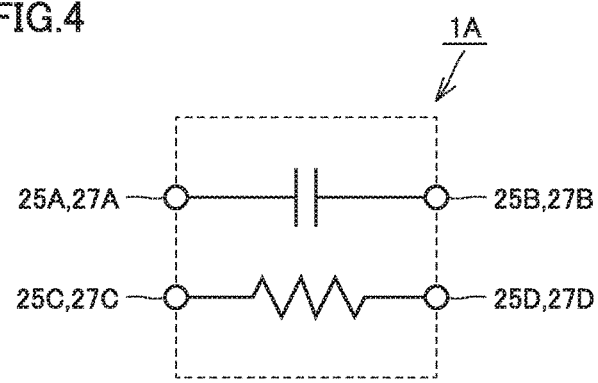
FIG. 4 is a diagram showing an equivalent circuit of the composite electronic component shown in FIG. 1.

FIG. 1 is a schematic perspective view of a composite electronic component according to a first preferred embodiment of the present invention. FIG. 2A is a schematic cross-sectional view along a line IIA-IIA shown in FIG. 1. FIG. 2B is a schematic cross-sectional view along a line IIB-IIB shown in FIG. 1. FIG. 3A is a top view of a resistor device shown in FIG. 1. FIG. 3B is a bottom view of the resistor device shown in FIG. 1. FIG. 4 is a diagram showing an equivalent circuit of the composite electronic component shown in FIG. 1. Referring first to FIGS. 1 to 4, a composite electronic component 1A in the present preferred embodiment is described.

As shown in FIG. 1, the composite electronic component 1A in the present preferred embodiment includes a capacitor device and a resistor device 20A, and has a rectangular or substantially rectangular parallelepiped shape as a whole.

Capacitor device 10 has a rectangular or substantially rectangular parallelepiped shape, and has a dimension in a length direction L defined later larger than a dimension in a width direction W defined later. The rectangular or substantially rectangular parallelepiped shape referred to herein includes a rectangular parallelepiped shape of capacitor device 10 including vertices and edges that are rounded and/or having an external surface that is stepped or roughened, for example.

Resistor device 20A has an elongate flat plate shape, and has a dimension in length direction L larger than a dimension in width direction W. The flat plate shape referred to herein includes a flat plate shape of resistor device 20A having vertices and edges that are rounded, and/or having an external surface stepped or roughened, for example.

Capacitor device 10 is disposed on resistor device 20A, and joined to resistor device 20A through a first joint member 31 and a second joint member 32 of a solder joint material or a conductive joint material, such as conductive adhesive, for example. The method of joining capacitor device 10 to resistor device 20A is not limited to the method of joining them with a conductive joint material, and another joining method may be used.

As to terms representing directions used to define composite electronic component 1A, the direction in which capacitor device 10 and resistor device 20A are arranged is referred to as height direction H, the direction in which a first external electrode 14A and a second external electrode 14B of capacitor device 10 described later are arranged is referred to as length direction L, and the direction perpendicular or substantially perpendicular to both height direction H and length direction L is referred to as width direction W. These terms are used in the following description.

As shown in FIGS. 1, 2A and 2B, capacitor device 10 is preferably a multilayer ceramic capacitor, for example, and includes a capacitor body 11, and first and second external electrodes 14A and 14B. Capacitor body 11 has a rectangular or substantially rectangular parallelepiped shape, and first and second external electrodes 14A and 14B structured in a film shaped on the external surface of capacitor body 11 are separated from each other.

Capacitor body 11 includes a plurality of dielectric layers 12 and a plurality of internal electrode layers 13 that are alternately stacked. In the present preferred embodiment, the direction in which a plurality of dielectric layers 12 and a plurality of internal electrode layers 13 are stacked is preferably identical or substantially identical to height direction H. The direction in which these layers are stacked, however, may be identical or substantially identical to width direction W.

Dielectric layer 12 is preferably made of a ceramic material containing, as a main component, barium titanate ($BaTiO_3$), calcium titanate ($CaTiO_3$), strontium titanate ($SrTiO_3$), calcium zirconium ($CaZrO_3$), or other suitable material, for example. Dielectric layers 12 may preferably further contain, as an accessory component, Mn, Mg, Si, Co, Ni, rare earth, or other suitable component, for example. In contrast, internal electrode layer 13 is preferably made of a metal material such as Ni, Cu, Ag, Pd, Ag—Pd alloy, Au, or other suitable metal material, for example.

First and second external electrodes 14A and 14B are each preferably made of a conductive film that is a multilayer film including a sintered metal layer and a plating layer, for example. The sintered metal layer is formed by baking a paste of Cu, Ni, Ag, Pd, Ag—Pd alloy, Au, or other suitable material, for example. The plating layer is preferably made of an Ni plating layer and an Sn plating layer covering the Ni plating layer, for example. Alternatively, the plating layer may be a Cu plating layer or Au plating layer. First and second external electrodes 14A and 14B may preferably each be defined by a plating layer only, or by a hardened conductive resin paste containing a metal component and a resin component, for example.

Capacitor body 11 includes a pair of end surfaces opposite to each other in length direction L, a pair of side surfaces opposite to each other in width direction W, and a pair of main surfaces opposite to each other in height direction H. Among these surfaces, a lower surface 11a, which is one of the pair of main surfaces opposite to each other in height direction H, faces resistor device 20A.

First external electrode 14A is disposed to abut one end surface of capacitor body 11 and respective portions of the pair of side surfaces and the pair of main surfaces of capacitor body 11. Second external electrode 14B is disposed to abut the other end surface of capacitor body 11 and respective portions of the pair of side surfaces and the pair of main surfaces of capacitor body 11. Accordingly, lower surface 11a of capacitor body 11 is partially covered by first and second external electrodes 14A and 14B that are separated from each other in length direction L. Between first and second external electrodes 14A and 14B, lower surface 11a of capacitor body 11 is exposed.

As shown in FIGS. 2A and 2B, one of a pair of internal electrode layers 13 that are adjacent to each other in height direction H with dielectric layer 12 interposed therebetween is electrically connected, in capacitor device 10, to one of first and second external electrodes 14A and 14B, and the other internal electrode layer 13 is electrically connected, in capacitor device 10, to the other of first and second external electrodes 14A and 14B. Accordingly, between first and second external electrodes 14A and 14B, a plurality of capacitor elements (C) are electrically connected in parallel.

Capacitor device 10 may be manufactured, for example, by the following non-limiting example of a process. A raw sheet is prepared by printing an electrically conductive paste that is to form an internal electrode layer 13, on a surface of a ceramic sheet (green sheet) that is to form a dielectric layer 12. A plurality of raw sheets thus prepared are stacked, joined together by pressure, and fired to produce capacitor body 11. After this, first and second external electrodes 14A and 14B are formed on the external surface of capacitor body 11 to form the capacitor device. A collective body into which a plurality of capacitor bodies 11 are integrated may be fabricated in advance, and the collective body may be separated into a plurality of capacitor bodies 11, and thereafter first and second external electrodes 14A and 14B may be formed on each capacitor body 11.

As shown in FIGS. 1 to 3B, resistor device 20A includes an electrically insulating base 21, a resistive element 22, a protective film 23, first, second, third, and fourth upper surface conductors 24A, 24B, 24C, and 24D, first, second, third, and fourth lower surface conductors 25A, 25B, 25C, and 25D, and first, second, third, and fourth side surface conductors 27A, 27B, 27C, and 27D defining and functioning as first, second, third, and fourth connection conductors, respectively. Specifically, the first connection conductor and the second connection conductor are preferably each defined by only a conductor located on the outer peripheral surface of base 21. The third connection conductor and the fourth connection conductor are preferably each defined by only a conductor located on the outer peripheral surface of base 21.

Base 21 has a flat plate shape, and is made of a resin material, such as epoxy resin, a ceramic material, such as alumina, or is made of a resin material or a ceramic material to which filler, woven fabric, or the like of an inorganic material or an organic material is added, for example. Preferably, an alumina substrate or a ceramic substrate including low temperature co-fired ceramic (LTCC) substrate is used as base 21.

Base 21 includes a pair of longitudinally-opposing side surfaces opposite to each other in length direction L, a pair of laterally-opposing side surfaces opposite to each other in width direction W, and a pair of main surfaces opposite to each other in height direction H. An upper surface 21a that is one of the pair of main surfaces faces capacitor device 10, and a lower surface 21b that is the other of the pair of main surfaces is a mount surface that faces a circuit board on which composite electronic component 1A is to be mounted.

As shown in FIGS. 2A to 3B, resistive element 22 is disposed at a predetermined position on upper surface 21a of base 21, and has a rectangular or substantially rectangular film shape as seen in the direction perpendicular or substantially perpendicular to upper surface 21a of base 21, for example. As resistive element 22, a metal film, a metal oxide film, a metal glaze film that is a mixture of a metal oxide film and glass, or other suitable material may be used, for example.

Protective film 23 covers at least a portion of resistive element 22 on upper surface 21a of base 21, and is made of an electrically insulating film of a glass material, a resin material, or other suitable material, for example. Preferably, protective film 23 covers the whole of resistive element 22 so that resistive element 22 is not exposed outward.

First and second upper surface conductors 24A and 24B are disposed on upper surface 21a of base 21, and each defined by a rectangular or substantially rectangular conductive film. First and second upper surface conductors 24A and 24B are separated from each other in length direction L and located at the opposite ends in length direction L of upper surface 21a of base 21.

Third and fourth upper surface conductors 24C and 24D are disposed on upper surface 21a of base 21, and each defined by a rectangular or substantially rectangular conductive film. Third and fourth upper surface conductors 24C and 24D are located between first upper surface conductor 24A and second upper surface conductor 24B in length direction L. Third and fourth upper surface conductors 24C and 24C are separated from each other in width direction W and located at the opposite ends in width direction W of upper surface 21a of base 21.

In order to prevent first to fourth upper surface conductors 24A to 24B from peeling off of base 21, it is preferable to embed at least a portion of each of first to fourth upper surface conductors 24A to 24D in base 21. In particular, in order to prevent first and second upper surface conductors 24A and 24B from peeling off from base 21 due to a bonding force applied when capacitor device 10 is joined to resistor device 20A, at least a portion of each of first and second upper surface conductors 24A and 24B is preferably embedded in base 21.

First and second lower surface conductors 25A and 25B are disposed on lower surface 21b of base 21, and each defined by a rectangular or substantially rectangular conductive film. First and second lower surface conductors 25A and 25B are separated from each other in length direction L and located at opposite ends, in length direction L of lower surface 21b of base 21.

Third and fourth lower surface conductors 25C and 25D are disposed on lower surface 21b of base 21, and each defined by a rectangular or substantially rectangular conductive film. Third and fourth lower surface conductors 25C and 25D are located between first lower surface conductor 25A and second lower surface conductor 25B in length direction L. Third and fourth lower surface conductors 25C and 25C are separated from each other in width direction W and located at the opposite ends in width direction W of lower surface 21b of base 21.

First side surface conductor 27A covers one of the pair of longitudinally-opposing side surfaces of base 21 that are opposite to each other in length direction L, and connects first upper surface conductor 24A to first lower surface conductor 25A. Second side surface conductor 27B covers the other of the pair of longitudinally-opposing side surfaces of base 21 that are opposite to each other in length direction L, and connects second upper surface conductor 24B to second lower surface conductor 25B.

Third side surface conductor 27C covers one of the pair of laterally-opposing side surfaces of base 21 that are opposite to each other in width direction W, and connects third upper surface conductor 24C to third lower surface conductor 25C. Fourth side surface conductor 27D covers the other of the pair of laterally-opposing side surfaces of base 21 that are opposite to each other in width direction W, and connects fourth upper surface conductor 24D to fourth lower surface conductor 25D.

First to fourth upper surface conductors 24A to 24D, first to fourth lower surface conductors 25A to 25D, and first to fourth side surface conductors 27A to 27D may each be made of any of various conductive materials. Preferably, they may each be made of a metal material such as Cu, Ni, and Sn, and formed by plating, baking of a conductive paste, sputtering, or other suitable method, for example.

Resistive element 22 is located between first upper surface conductor 24A and second upper surface conductor 24B in length direction L, and one end in width direction W of resistive element 22 covers a portion of third upper surface conductor 24C and the other end in width direction W thereof covers a portion of fourth upper surface conductor 24D. Accordingly, third and fourth upper surface conductors 24C and 24D are connected to resistive element 22.

In order to prevent physical interference between resistor device 20A and capacitor device 10, the dimension in length direction L of resistive element 22 is preferably smaller than the distance between first external electrode 14A and second external electrode 14B of capacitor device 10.

In order to prevent contact with other conductive members, protective film 23 preferably covers not only resistive element 22 but also third and fourth upper surface conductors 24C and 24D. Third and fourth upper surface conductors 24C and 24D, however, may not necessarily be covered by protective film 23. Third and fourth upper surface conductors 24C and 24D may be covered only partially, or may not be covered at all.

Resistor device 20A may be manufactured, for example, through the following non-limiting example of a process.

First, electrically insulating base 21 is prepared. Next, a conductive paste is printed and baked on upper surface 21a and lower surface 21b of base 21, or a metal material is deposited by sputtering on upper surface 21a and lower surface 21b of base 21, for example, to form first to fourth upper surface conductors 24A to 24D and first to fourth lower surface conductors 25A to 25D.

After this, a conductive paste is applied and hardened on the pair of longitudinally-opposing side surfaces and the pair of laterally-opposing side surfaces of base 21, or a plating layer is formed on the pair of longitudinally-opposing side surfaces and the pair of laterally-opposing side surfaces of base 21, for example, to form first to fourth side surface conductors 27A to 27D.

Then, a material that is to form resistive element 22 is formed by printing or other suitable method on upper surface 21a of base 21 to connect resistive element 22 to third and fourth upper surface conductors 24C and 24D.

After this, a glass material, a resin material, or other suitable material is applied by printing or other suitable method onto upper surface 21a of base 21 to cover resistive element 22, and form protective film 23.

In this way, resistor device 20A is manufactured. The above-described procedure is given merely by way of example. The order of the steps in the above-described process may be partially changed, or any suitable method other than the above-described methods may be used to form each element. Alternatively, a collective body into which a plurality of resistor devices 20A are integrated may be fabricated in advance and the collective body may be divided into separate resistor devices 20A so that a plurality of resistor devices 20A are manufactured together.

As shown in FIGS. 1, 2A, and 2B, in composite electronic component 1A in the present preferred embodiment, capacitor device 10 and resistor device 20A are joined together through first and second joint members 31 and 32.

More specifically, capacitor device 10 is mounted on upper surface 21a of resistor device 20A in height direction H. Lower surface 11a of capacitor body 11 faces upper surface 21a of base 21 in height direction H, and first and second external electrodes 14A and 14B of capacitor device 10 are joined to respective corresponding first and second upper surface conductors 24A and 24B of resistor device 20A through first and second joint members 31 and 32, respectively.

Accordingly, first and second external electrodes 14A and 14B are electrically connected to first and second upper surface conductors 24A and 24B, respectively. Then, first and second upper surface conductors 24A and 24B and first and second side surface conductors 27A and 27B connected respectively to first and second upper surface conductors 24A and 24B define and function as a relay conductor for capacitor device 10 to electrically connect first and second external electrodes 14A and 14B to first and second lower surface conductors 25A and 25B, respectively.

Thus, first and second lower surface conductors 25A and 25B and first and second side surface conductors 27A and 27B of resistor device 20A are define and function as terminal conductors that are connecting terminals connecting capacitor device 10 to a circuit board.

In contrast, resistive element 22 of resistor device 20A is electrically connected to third and fourth upper surface conductors 24C and 24D of resistor device 20A as described above. Then, third and fourth side surface conductors 27C and 27D connected respectively to third and fourth upper surface conductors 24C and 24D define and function as a relay conductor for resistive element 22 to electrically connect third and fourth upper surface conductors 24C and 24D to third and fourth lower surface conductors 25C and 25D, respectively.

Thus, third and fourth lower surface conductors 25C and 25D and as third and fourth side surface conductors 27C and 27D of resistor device 20A define and function as terminal conductors that are connecting terminals connecting resistor device 20A to a circuit board.

Accordingly, composite electronic component 1A in the present preferred embodiment includes four terminal conductors that are connecting terminals to a circuit board, and has an equivalent circuit as shown in FIG. 4.

Composite electronic component 1A configured in the above-described manner eliminates the need to provide a resistive element directly on the surface of the capacitor body, which facilitates processing during manufacture. In addition, electrical characteristics of the resistive element are not restricted by the size of the capacitor body and/or the shape and the size, for example, of the pair of external electrodes disposed on the capacitor body. Consequently, the degree of freedom in designing the composite electronic component is significantly improved.

Composite electronic component 1A configured in the above-described manner also eliminates the need to fabricate capacitor device 10 and resistor device 20A to be integrated so that they are rectangular or substantially rectangular parallelepipeds that are identical or substantially identical in shape and size. In addition, electrical characteristics of capacitor device 10 and resistor device 20A are not restricted in this sense. The degree of freedom in designing the composite electronic component is therefore significantly improved in this respect as well.

Further, regarding composite electronic component 1A configured in the above-described manner, the resistor element (R) and the capacitor element (C) are not electrically connected in parallel in composite electronic component 1A. In terms of circuit design, the degree of freedom in designing a circuit is also significantly improved. Specifically, the resistor element (R) and the capacitor element (C) are electrically connected to each other on a circuit board on which composite electronic component 1A is mounted, and therefore, they can be connected either in series or in parallel. In some cases, the resistor element and the capacitor element may be connected to respective separate circuits. Accordingly, a composite electronic component that is applicable to a variety of circuits is provided.

In addition, composite electronic component 1A configured in the above-described manner also enables a reduction in the surface area on which the component is mounted, due to the integration of capacitor device 10 and resistor device 20A into the composite electronic component.

In order to reduce the surface area, preferably, the dimension of capacitor device 10 in length direction L is larger than the dimension of resistor device 20A in length direction L, and the dimension of capacitor device 10 in width direction W is larger than the dimension of resistor device 20A in width direction W. In order to increase the capacitance of capacitor device 10, preferably, the dimension of capacitor device 10 in height direction H is larger than the dimension of resistor device 20A in height direction H.

As described above, regarding composite electronic component 1A and resistor device 20A included in composite electronic component 1A in the present preferred embodiment, the resistor element (R) and the capacitor element (C) each having desired electrical characteristics are easily combined, which enables a higher degree of freedom in designing the composite electronic component and a higher degree of freedom in designing a circuit on a circuit board on which the composite electronic component is mounted.

As capacitor device 10 to be integrated into the composite electronic component, multiple types of capacitor devices 10 that are different in electrical characteristics may be prepared in advance. In addition, as resistor device 20A to be integrated into the composite electronic component, multiple types of resistor devices 20A that are different in electrical characteristics may be prepared in advance. Then, a capacitor device and a resistor device may be selected and combined appropriately. In this way, a composite electronic component including both a resistor element (R) and a capacitor element (C) having desired electrical characteristics is easily manufactured. At this time, the multiple types of capacitor devices may not necessarily be identical to each other in shape and dimensions, and the multiple types of resistor devices may not necessarily be identical to each other in shape and dimensions. As long as a selected type of capacitor device and a selected type of resistor device are able to be stacked and combined into a composite electronic component, the multiple types of capacitor devices may be different and the multiple types of resistor devices may be different in terms of shape and dimensions.

In the present preferred embodiment, third upper surface conductor 24C and fourth upper surface conductor 24D that are connected to resistive element 22 are separated from each other in width direction W perpendicular or substantially perpendicular to length direction L in which first upper surface conductor 24A and second upper surface conductor 24B functioning as a relay conductor for capacitor device 10 are arranged. This configuration enables an increase of distances by which first to fourth upper surface conductors 24A and 24D are separated from each other as well as increase of the area where resistive element 22 may be disposed on upper surface 21a of base 21. Both electrical insulation between first to fourth upper surface conductors 24A to 24D and a high degree of freedom in adjusting electrical characteristics of resistive element 22 are therefore ensured.

Figure 5:
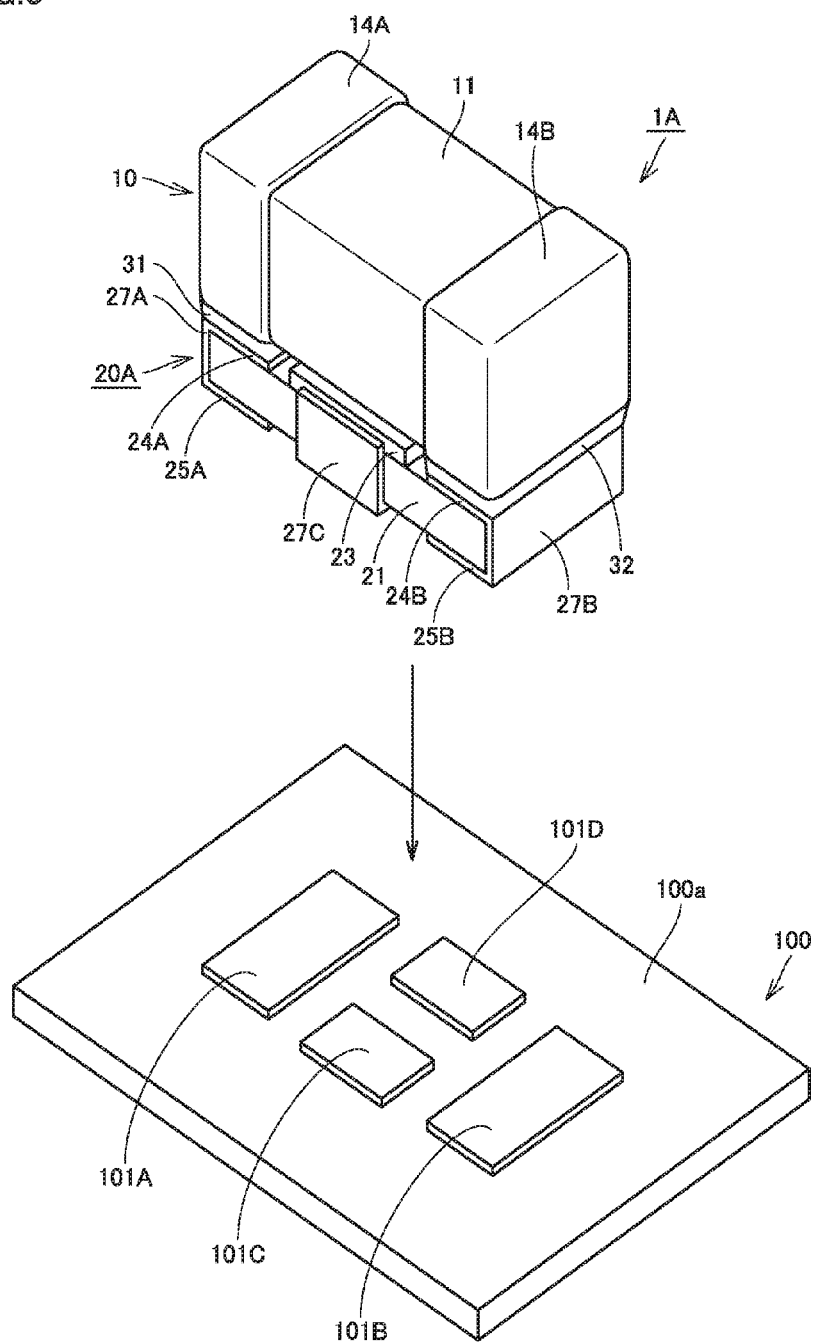
FIG. 5 is a schematic perspective view illustrating how the composite electronic component shown in FIG. 1 is mounted on a circuit board.
Figure 6A:
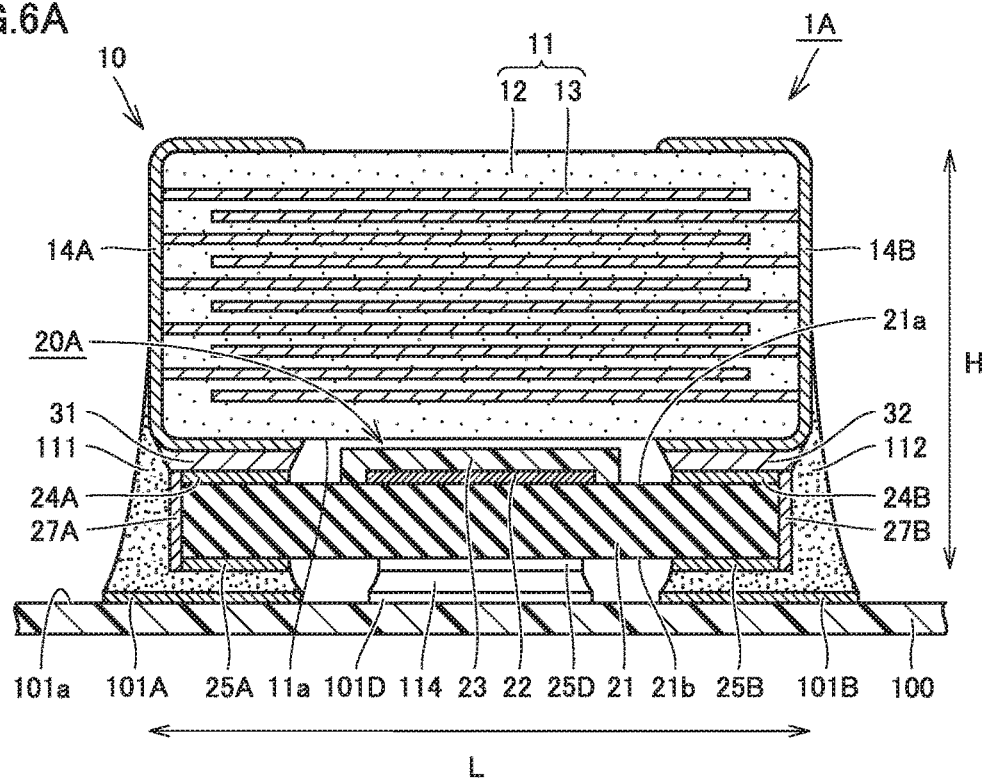
FIG. 6A is a lengthwise cross-sectional view of a mount structure including the composite electronic component shown in FIG. 1.
Figure 6B:
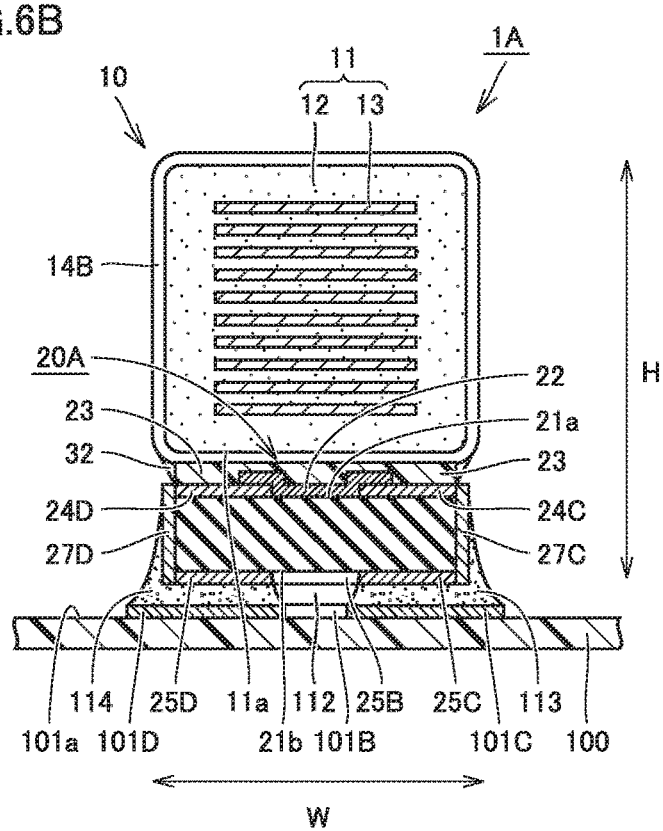
FIG. 6B is a widthwise cross-sectional view of the mount structure including the composite electronic component shown in FIG. 1.

FIG. 5 is a schematic perspective view illustrating how the composite electronic component shown in FIG. 1 is mounted on a circuit board. FIG. 6A is a lengthwise cross-sectional view of a mount structure including the composite electronic component shown in FIG. 1. FIG. 6B is a widthwise cross-sectional view of the mount structure including the composite electronic component shown in FIG. 1. Referring to FIGS. 5, 6A, and 6B, a mount structure to mount composite electronic component 1A on a circuit board 100 in the present preferred embodiment is described.

As shown in FIG. 5, composite electronic component 1A is mounted on circuit board 100 by disposing composite electronic component 1A so that lower surface 21b of base 21 of resistor device 20A faces a main surface 100a of circuit board 100, and using a solder joint material or a conductive joint material, such as conductive adhesive, for example.

As shown in FIGS. 5, 6A, and 6B, circuit board 100 is an electrically insulating substrate including a conductive pattern provided on main surface 100a. As a material for circuit board 100, a resin material, such as epoxy resin, a ceramic material such as alumina, or a resin material or a ceramic material to which filler, woven fabric, or the like of an inorganic material or an organic material is added, for example, may be used. Generally, a glass epoxy substrate in which glass woven fabric is added to a base material of epoxy resin is preferably used as circuit board 100.

On main surface 100a of circuit board 100, first to fourth lands 101A to 101D are disposed for composite electronic component 1A. First to fourth lands 101A to 101D each correspond to a portion of the conductive pattern and are separated from each other.

The first to fourth lands 101A to 101D have respective sizes corresponding to respective sizes of first to fourth lower surface conductors 25A to 25D respectively of composite electronic component 1A, and include respective portions facing their associated first to fourth lower surface conductors 25A to 25D in the direction perpendicular or substantially perpendicular to main surface 100a of circuit board 100. As the material for first to fourth lands 101A to 101D, any of various conductive materials may be used, and preferably a metal material, such as Cu is used.

The first to fourth lower surface conductors 25A to 25D and first to fourth side surface conductors 27A to 27D of composite electronic component 1A are joined to the first to fourth lands 101A to 101D disposed on circuit board 100 by first, second, third, and fourth joint mount members 111, 112, 113, and 114 each made of a conductive joint material. First to fourth side surface conductors 27A to 27D of composite electronic component 1A enable first to fourth joint mount members 111 to 114 to include a fillet of an appropriate size, which increases the stability of mounted composite electronic component 1A.

Specific ones of first to fourth lands 101A to 101D may be electrically connected to each other to enable capacitor device and resistor device 20A included in composite electronic component 1A to be connected either in series or in parallel on circuit board 100.

Figure 7A:
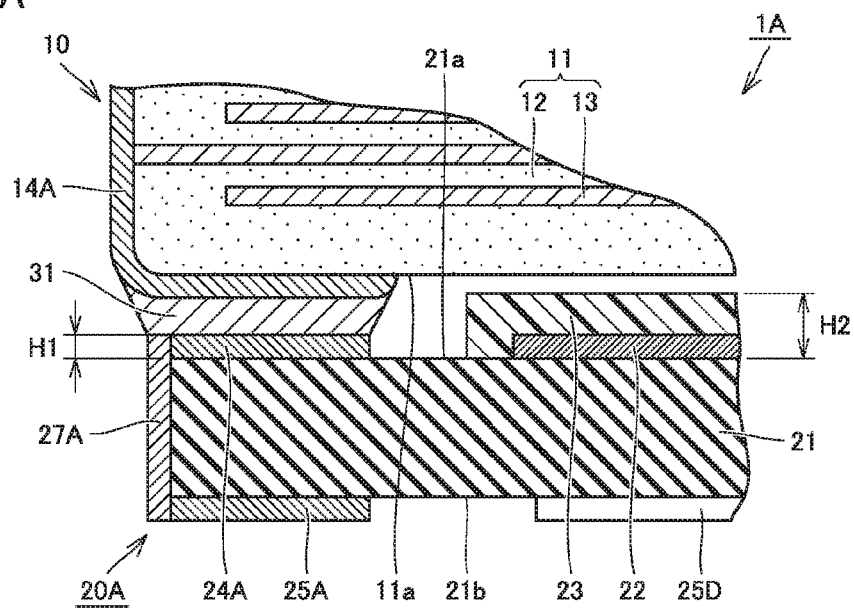
FIG. 7A is a cross-sectional view in an enlarged form of a main portion of the composite electronic component shown in FIG. 1.
Figure 7B:
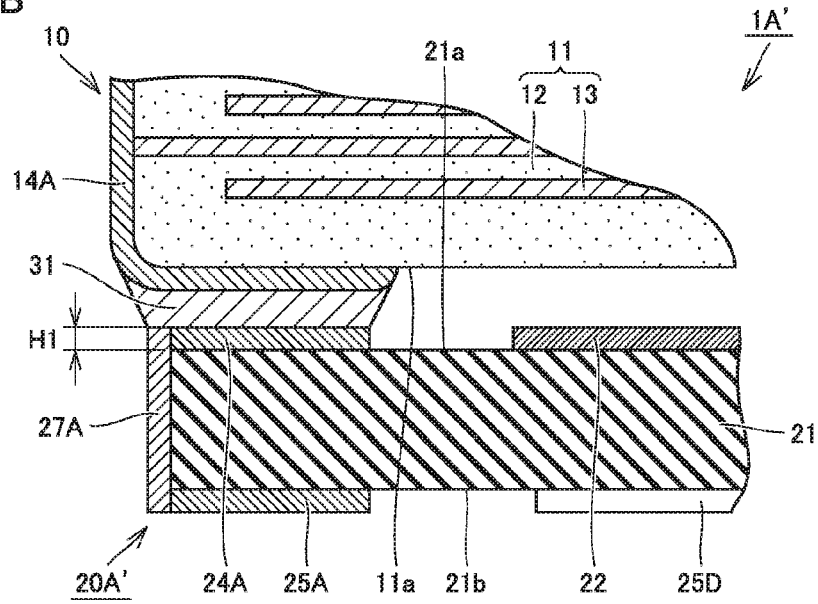
FIG. 7B is an enlarged cross-sectional view of the main component of the composite electronic component according to another example configuration based on the first preferred embodiment of the present invention.

FIG. 7A is an enlarged cross-sectional view of a main portion of the composite electronic component in the present preferred embodiment. FIG. 7B is an enlarged cross-sectional view of the main component of the composite electronic component according to another example configuration based on the present preferred embodiment.

As shown in FIG. 7A, in composite electronic component 1A in the present preferred embodiment, first and second joint members 31 and 32 are located between first and second upper surface conductors 24A and 24B on upper surface 21a of base 21 of resistor device 20A and first and second external electrodes 14A and 14B located on lower surface 11a of capacitor body 11 of capacitor device 10, respectively.

The distance in height direction H between upper surface 21a of base 21 and lower surface 11a of capacitor body 11 is therefore the sum of the thickness in height direction H of each of first and second upper surface conductors 24A and 24B, the thickness in height direction H of the portion of each of first and second external electrodes 14A and 14B facing first and second upper surface conductors 24A and 24B, and the thickness in height direction H of each of first and second joint members 31 and 32.

Resistive element 22 and protective film 23 disposed on upper surface 21a of base 21 face the exposed portion of lower surface 11a of capacitor body 11.

Accordingly, in composite electronic component 1A according to the present preferred embodiment, even when a maximum height H1 of first and second upper surface conductors 24A and 24B from upper surface 21a of base 21 and a maximum height H2 of protective film 23 from upper surface 21a satisfy the condition H1<H2, protective film 23 and resistive element 22 do not physically interfere with capacitor device 10 as long as maximum height H2 is smaller than the distance in height direction H between upper surface 21a of base 21 and lower surface 11a of capacitor body 11. Thus, increase of the dimension in height direction H of composite electronic component 1A is avoided. Preferably, maximum height H2 is smaller than the sum of maximum height H1 and the thickness of the portion of first and second external electrodes 14A and 14B located on lower surface 11a of capacitor device 10.

As shown in FIG. 7B, in a composite electronic component 1A' according to another example configuration based on the present preferred embodiment, resistive element 22 is not covered by the protective film, and instead, is exposed on upper surface 21a of base 21.

First Modification

Figure 8A:
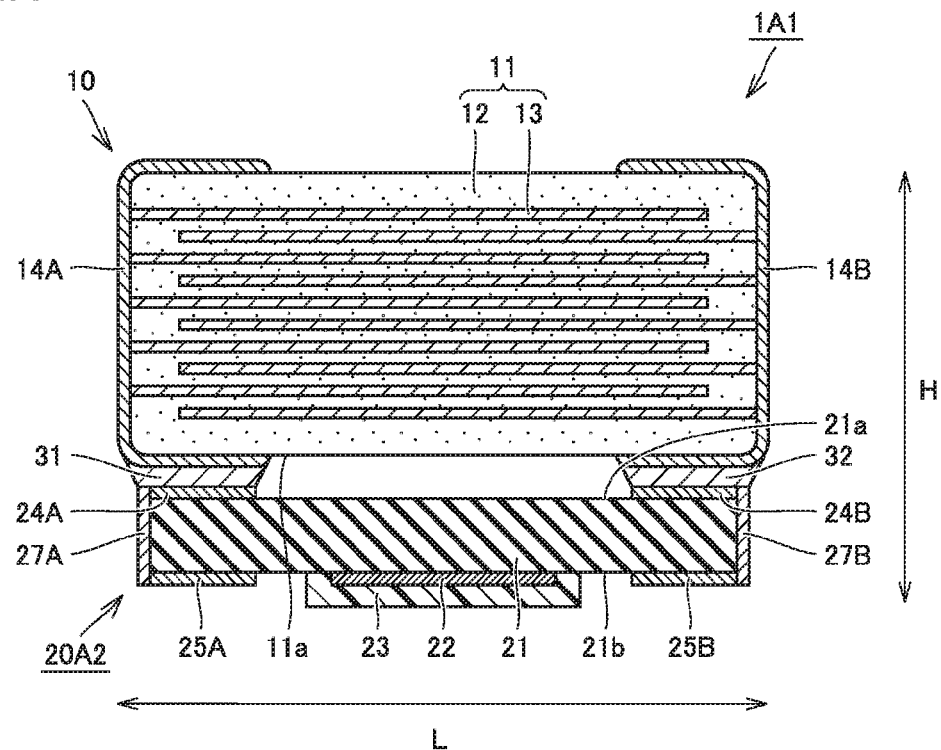
FIG. 8A is a lengthwise cross-sectional view of a composite electronic component according to a first modification of a preferred embodiment of the present invention.
Figure 8B:
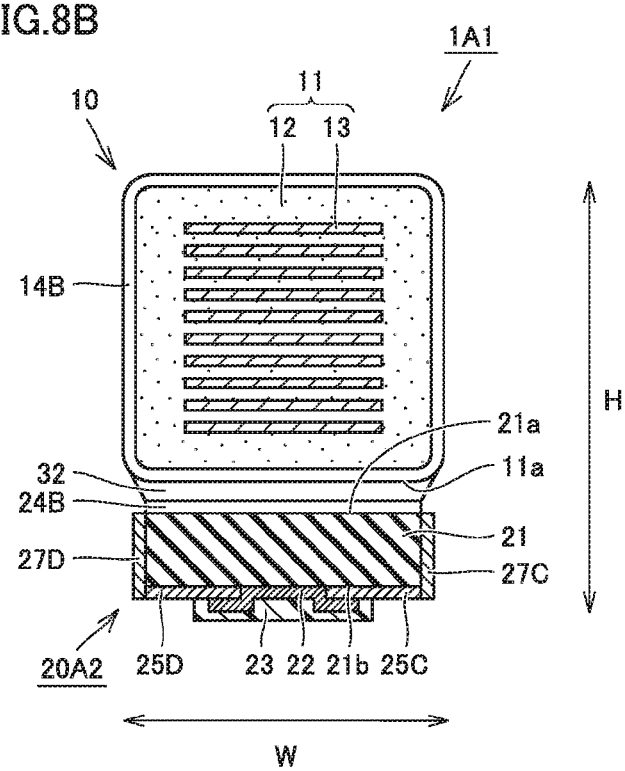
FIG. 8B is a widthwise cross-sectional view of the composite electronic component according to the first modification of a preferred embodiment of the present invention.

FIG. 8A is a lengthwise cross-sectional view of a composite electronic component according to a first modification of a preferred embodiment of the present invention. FIG. 8B is a widthwise cross-sectional view of the composite electronic component according to the first modification. Referring to FIGS. 8A and 8B, a composite electronic component 1A1 according to the first modification of the present preferred embodiment is described below.

As shown in FIGS. 8A and 8B, composite electronic component 1A1 in the first modification differs from composite electronic component 1A in that the first modification includes a differently structured resistor device 20A2. Resistor device 20A2 differs from resistor device 20A primarily in the position of resistive element 22 disposed on base 21.

Specifically, resistive element 22 is disposed on the lower surface of base 21 and located between first lower surface conductor 25A and second lower surface conductor 25B in length direction L.

One end in width direction W of resistive element 22 covers a portion of third lower surface conductor 25C and the other end in width direction W thereof covers a portion of fourth lower surface conductor 25D. Accordingly, third and fourth lower surface conductors 25C and 25D are connected to resistive element 22.

Although resistor device 20A2 in the first modification does not include third and fourth upper surface conductors 24C and 24D included in resistor device 20A, resistor device 20A2 may include these third and fourth upper surface conductors 24C and 24D without suffering from any particular disadvantages.

The above configuration of the first modification also produces similar effects to those described above in connection with the present preferred embodiment, and enables a resistor element (R) and a capacitor element (C) having desired electrical characteristics to be easily combined at low cost. Accordingly, a higher degree of freedom in designing the composite electronic component and a higher degree of freedom in designing a circuit on a circuit board on which the composite electronic component is mounted are achieved.

Second Modification

Figure 9A:
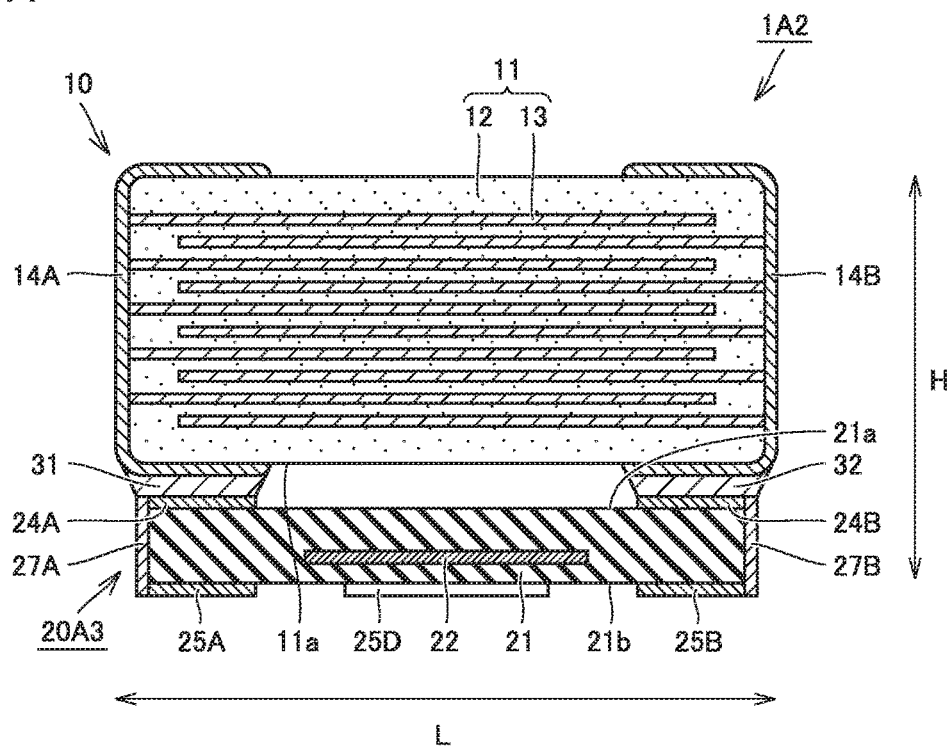
FIG. 9A is a lengthwise cross-sectional view of a composite electronic component according to a second modification of a preferred embodiment of the present invention.
Figure 9B:
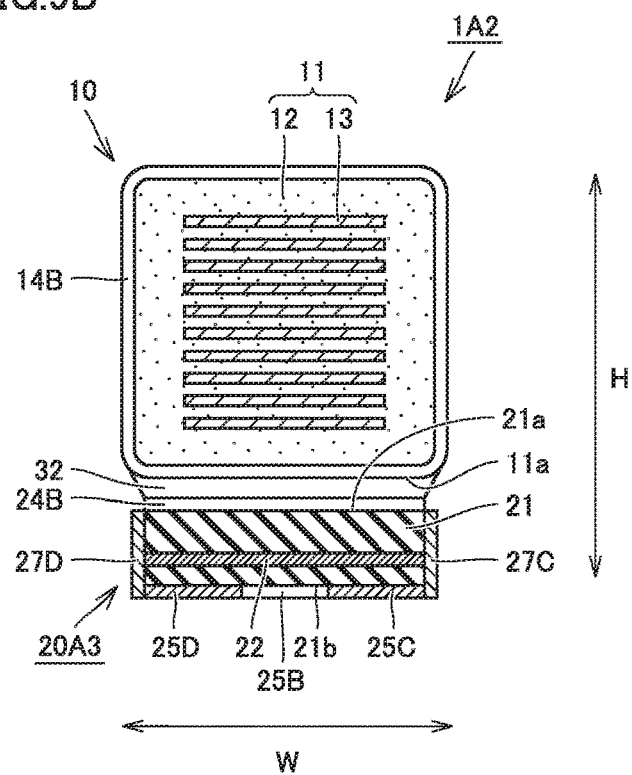
FIG. 9B is a widthwise cross-sectional view of the composite electronic component according to the second modification of a preferred embodiment of the present invention.

FIG. 9A is a lengthwise cross-sectional view of a composite electronic component according to a second modification of a preferred embodiment of the present invention. FIG. 9B is a widthwise cross-sectional view of the composite electronic component according to the second modification. Referring to FIGS. 9A and 9B, a composite electronic component 1A2 according to the second modification based on the present preferred embodiment is described below.

As shown in FIGS. 9A and 9B, composite electronic component 1A2 in the second modification differs from composite electronic component 1A in that the second modification includes a differently structured resistor device 20A3. Resistor device 20A3 differs from resistor device 20A primarily in the position of resistive element 22 of base 21. Specifically, resistive element 22 is embedded in base 21 and located between first side surface conductor 27A and second side surface conductor 27B in length direction L.

One end in width direction W of resistive element 22 is connected to third side surface conductor 27C and the other end in width direction W thereof is connected to fourth side surface conductor 27D.

As shown in FIGS. 9A and 9B, resistor device 20A3 in the second modification may not include third and fourth upper surface conductors 24C and 24D included in resistor device 20A.

The above configuration of the second modification also produces similar effects to those described above in connection with the present preferred embodiment, and enables a resistor element (R) and a capacitor element (C) having desired electrical characteristics to be easily combined at low cost. Accordingly, a higher degree of freedom in designing the composite electronic component and a higher degree of freedom in designing a circuit on a circuit board on which the composite electronic component is mounted are achieved.

Second Preferred Embodiment

Figure 11A:
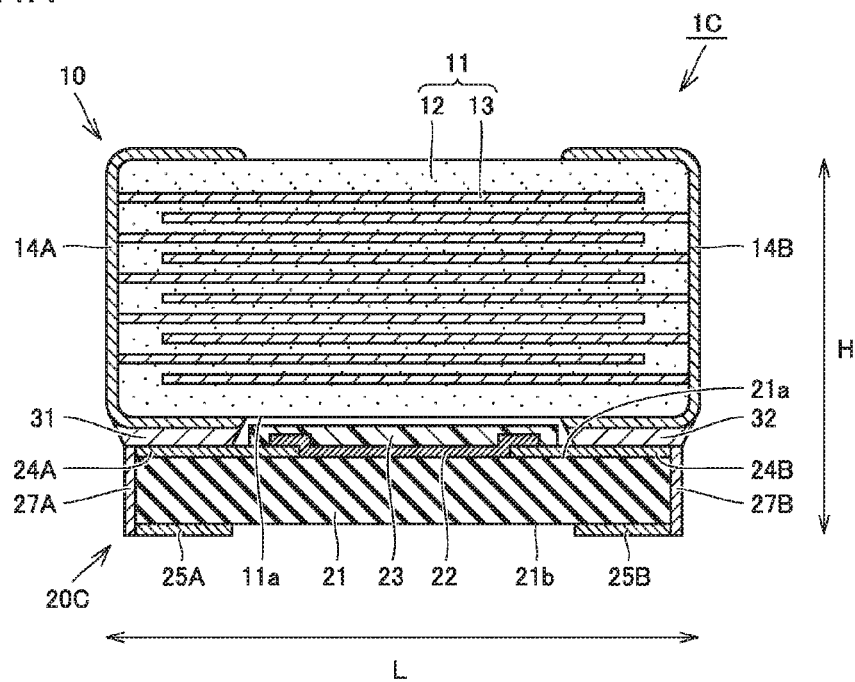
FIG. 11A is a schematic cross-sectional view along a line XIA-XIA shown in FIG. 10.
Figure 11B:
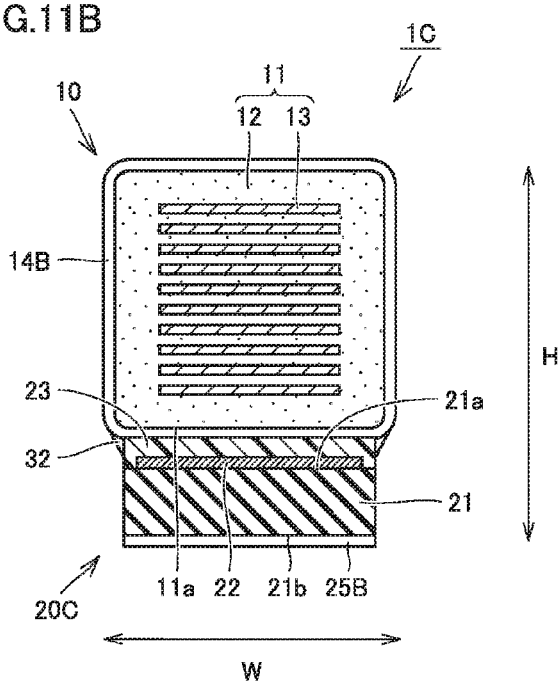
FIG. 11B is a schematic cross-sectional view along a line XIB-XIB shown in FIG. 10.

FIG. 10 is a schematic perspective view of a composite electronic component in a second preferred embodiment of the present invention. FIG. 11A is a schematic cross-sectional view along a line XIA-XIA shown in FIG. 10. FIG. 11B is a schematic cross-sectional view along a line XIB-XIB shown in FIG. 10. FIG. 12A is a top view of a resistor device shown in FIG. 10. FIG. 12B is a bottom view of the resistor device shown in FIG. 10. FIG. 13 is a diagram showing an equivalent circuit of the composite electronic component shown in FIG. 10. Referring to FIGS. 10 to 13, a composite electronic component 1C in the present preferred embodiment is described below.

As shown in FIGS. 10 to 13, composite electronic component 1C in the present preferred embodiment differs from composite electronic component 1A in that composite electronic component 1C includes a differently structured resistor device 20C. Resistor device 20C differs from resistor device 20A primarily in that resistor device 20C does not include third and fourth upper surface conductors 24C and 24C, third and fourth lower surface conductors 25C and 25D, and third and fourth side surface conductors 27C and 27D. In addition, in the present preferred embodiment, the first connection conductor and the second connection conductor are each defined by only a conductor located on the outer peripheral surface of base 21.

Specifically, as shown in FIGS. 11A to 12B, resistor device 20C does not include another conductor on the portion between first and second upper surface conductors 24A and 24B in length direction L of upper surface 21a of base 21. Resistor device 20C also does not include another conductor on the portion between first and second lower surface conductors 25A and 25B in length direction L of lower surface 21b of base 21.

One end in length direction L of resistive element 22 covers a portion of first upper surface conductor 24A and the other end in length direction L thereof covers a portion of second upper surface conductor 24B. Accordingly, first and second upper surface conductors 24A and 24B are connected to resistive element 22.

In this case, resistive element 22 of resistor device 20C is electrically connected to first and second upper surface conductors 24A and 24B of resistor device 20C. Therefore, first and second side surface conductors 27A and 27B connected respectively to first and second upper surface conductors 24A and 24B define and function as a relay conductor for resistive element to electrically connect first and second upper surface conductors 24A and 24B to first and second lower surface conductors 25A and 25B, respectively.

Thus, first and second lower surface conductors 25A and 25B and first and second side surface conductors 27A and 27B of resistor device 20C are structured to function as terminal conductors that are connecting terminals connecting resistor device 20C to a circuit board.

In this case, first and second upper surface conductors 24A and 24B and first and second side surface conductors 27A and 27B are also structured to function as a relay conductor for capacitor device 10. In addition, first and second lower surface conductors 25A and 25B and first and second side surface conductors 27A and 27B are also structured to function as terminal conductors that are connecting terminals connecting capacitor device 10 to a circuit board.

Accordingly, composite electronic component 1C in the present preferred embodiment includes two terminal conductors that are connecting terminals to a circuit board, and has an equivalent circuit as shown in FIG. 13.

The configuration of the present preferred embodiment also produces similar effects to those described above in connection with the first preferred embodiment, and enables a resistor element (R) and a capacitor element (C) having desired electrical characteristics to be easily combined. A higher degree of freedom in designing the composite electronic component is thus achieved.

Third Preferred Embodiment

Figure 15:
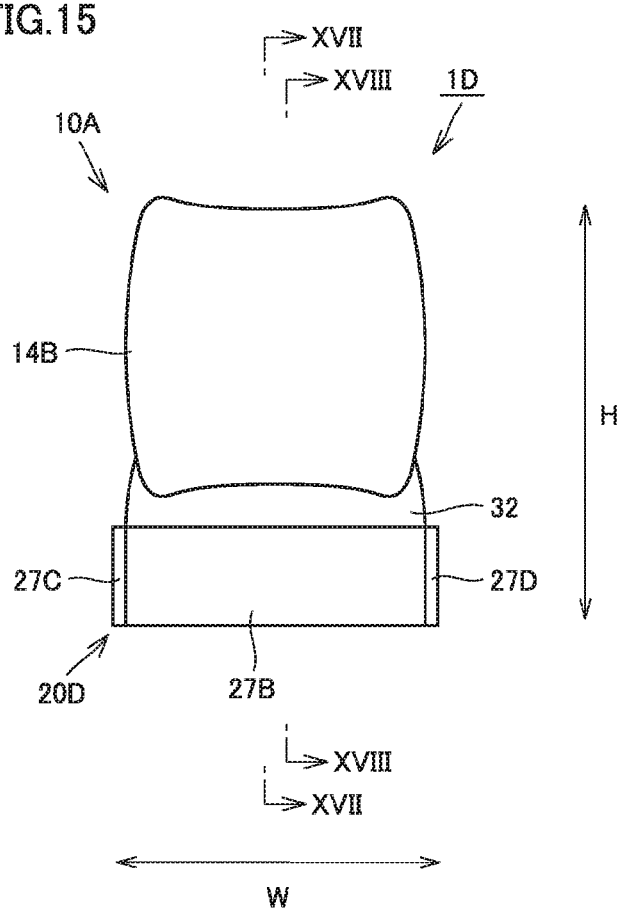
FIG. 15 is a diagram of the composite electronic component in FIG. 14 as seen in the direction of an arrow XV.
Figure 16:
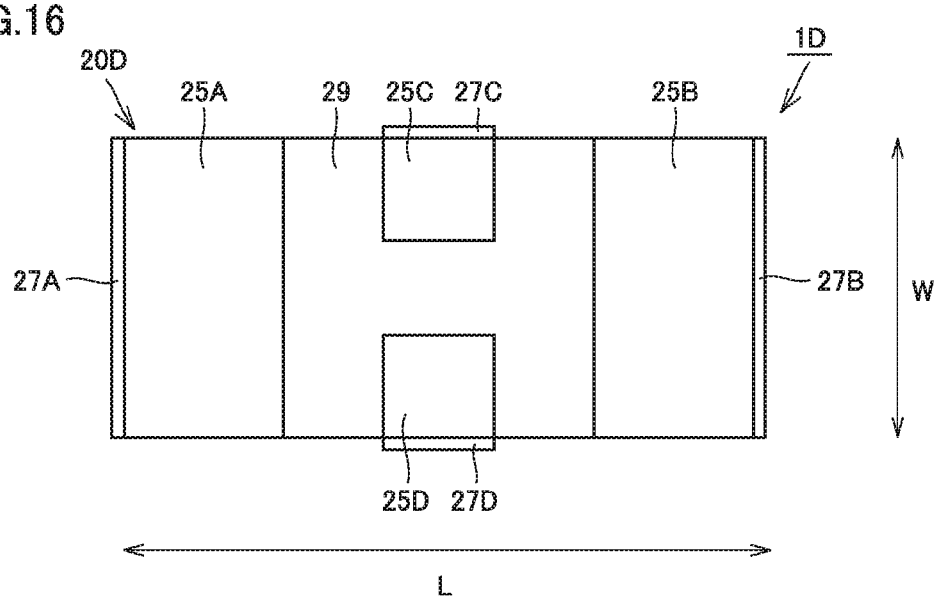
FIG. 16 is a diagram of the composite electronic component in FIG. 14 as seen in the direction of an arrow XVI.
Figure 17:
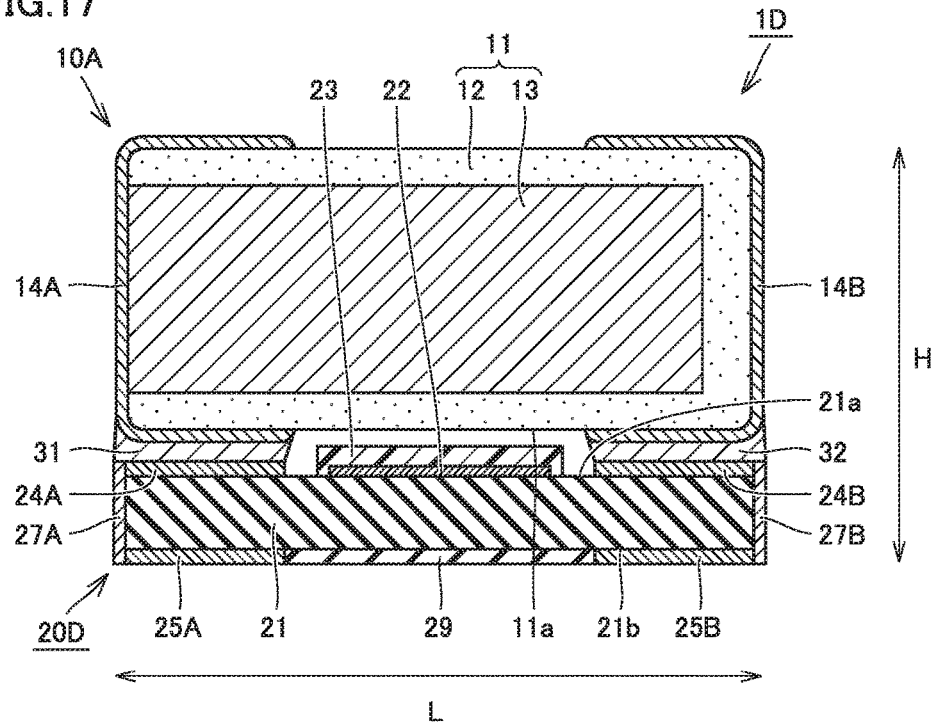
FIG. 17 is a cross-sectional view of the composite electronic component in FIG. 15 as seen in the direction of an arrow XVII-XVII.
Figure 18:
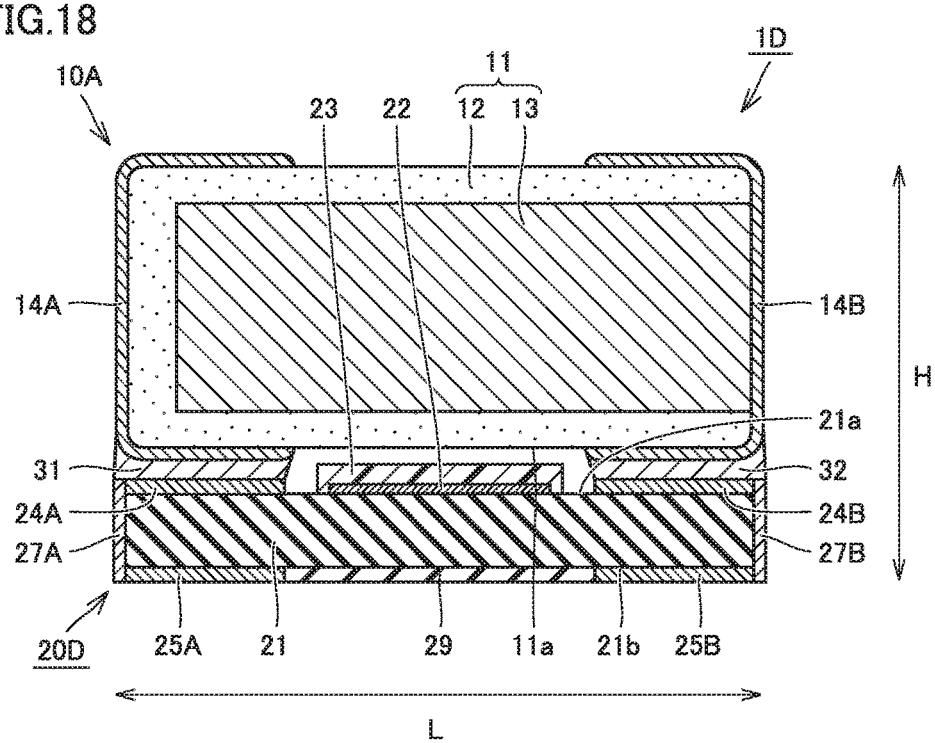
FIG. 18 is a cross-sectional view of the composite electronic component in FIG. 15 as seen in the direction of an arrow XVIII-XVIII.
Figure 19:
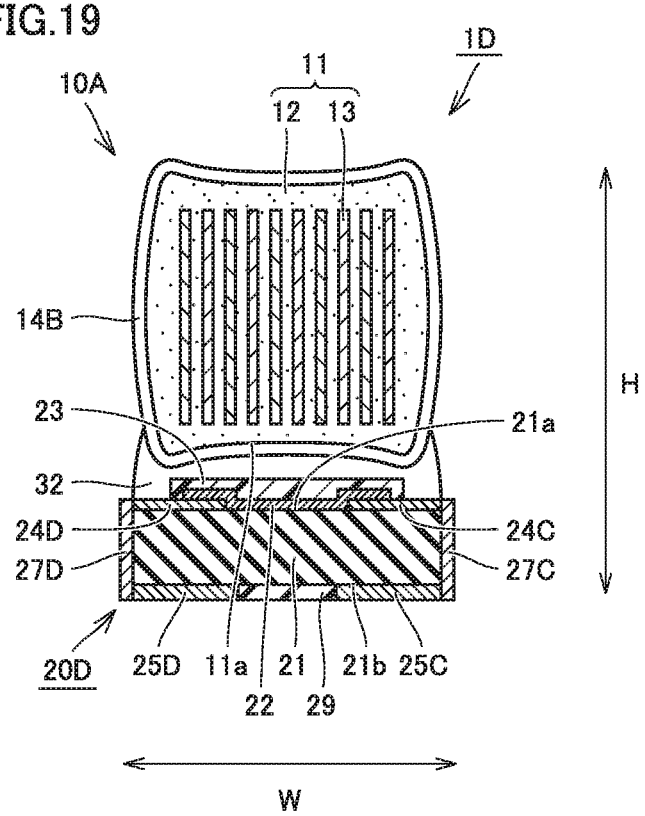
FIG. 19 is a cross-sectional view of the composite electronic component in FIG. 14 as seen in the direction of an arrow XIX-XIX.

FIG. 14 is a side view of a composite electronic component in a third preferred embodiment of the present invention. FIG. 15 is a diagram of the composite electronic component in FIG. 14 as seen in the direction of an arrow XV. FIG. 16 is a diagram of the composite electronic component in FIG. 14 as seen in the direction of an arrow XVI. FIG. 17 is a cross-sectional view of the composite electronic component in FIG. 15 as seen in the direction of an arrow XVII-XVII. FIG. 18 is a cross-sectional view of the composite electronic component in FIG. 15 as seen in the direction of an arrow XVIII-XVIII. FIG. 19 is a cross-sectional view of the composite electronic component in FIG. 14 as seen in the direction of an arrow XIX-XIX.

As shown in FIGS. 14 to 19, a composite electronic component 1D in a third preferred embodiment of the present invention includes a capacitor device 10A and a resistor device 20D. In the present preferred embodiment, the first and second connection conductors are each defined by only a conductor located on the outer peripheral surface of base 21, and third and fourth connection conductors are each defined by only a conductor located on the outer peripheral surface of base 21.

Capacitor body 11 of capacitor device 10A includes a plurality of internal electrode layers 13 that are stacked together. Among a plurality of internal electrode layers 13, one of a pair of internal electrode layers 13 that are adjacent to each other is electrically connected to one of first and second external electrodes 14A and 14B, and the other of the pair of internal electrode layers 13 is electrically connected to the other of first and second external electrodes 14A and 14B. The stacking direction in which a plurality of internal electrode layers 13 are stacked is preferably perpendicular or substantially perpendicular to height direction H and parallel or substantially parallel to width direction W.

As described above, capacitor body 11 is fabricated by stacking a plurality of ceramic green sheets each with a conductive paste printed thereon, and pressing these sheets in the direction in which they are stacked together. In the resultant stack formed by pressing, the portion where internal electrode layers 13 are located differs in thickness from the portion where internal electrode layers 13 are not located. Specifically, the thickness of the portion where internal electrode layers 13 are located is larger than the thickness of the portion where internal electrode layers 13 are not located.

Consequently, as seen in length direction L, the surfaces of capacitor device 10A that cross the stack direction in which a plurality of internal electrode layers 13 are stacked are curved outward in a convex shape. Specifically, each of the side surfaces of capacitor body 11 is curved so that its center in height direction H is located outward in width direction W relative to its ends in height direction H.

In the present preferred embodiment, as seen in length direction L, the surfaces of capacitor device 10A that extend along the stack direction of a plurality of internal electrode layers 13 are curved so that respective centers are recessed inward. Specifically, each of the pair of main surfaces of capacitor body 11 is curved so that its ends in width direction W protrude outward in height direction H relative to its center in width direction W. The depth of the recess of each curved surface is preferably about 5 µm or less, for example. As seen in length direction L, the surfaces of capacitor device 10A that extend along the stack direction of a plurality of internal electrode layers 13 are more preferably flat surfaces.

In composite electronic component 1D, first upper surface conductor 24A and first external electrode 14A are connected to each other through first joint member 31, and second upper surface conductor 24B and second external electrode 14B are connected to each other through second joint member 32. First upper surface conductor 24A and first external electrode 14A are not in direct contact with each other, and second upper surface conductor 24B and second external electrode 14B are not in direct contact with each other.

Preferably, each of first joint member 31 and second joint member 32 has a thickness of about 10 µm or more, for example. Preferably, the shortest distance between lower surface 11a of capacitor body 11 and resistor device 20D in height direction H is about 20 µm or more, for example.

In the present preferred embodiment, each of first joint member 31 and second joint member 32 is made of a conductive joint material. A main component of the conductive joint material is preferably Sn (tin), for example. The conductive joint material may contain Sb (antimony) or Au (gold). Ag (silver) and Cu (copper) are absent in the conductive joint material. The conductive joint material preferably has a melting point of about 237° C. or more, for example. The conductive joint material may not be used, and each of first joint member 31 and second joint member 32 may be formed by re-melted Sn plating on the surfaces of first and second upper surface conductors 24A and 24B or first and second external electrodes 14A and 14B.

On lower surface 21b of base 21, a protective film 29 is preferably disposed to separate first and second lower surface conductors 25A and 25B and third and fourth lower surface conductors 25C and 25D from each other. Protective film 29 is preferably made of an electrically insulating film of a glass material, a resin material, or other suitable material, for example.

Figure 20:
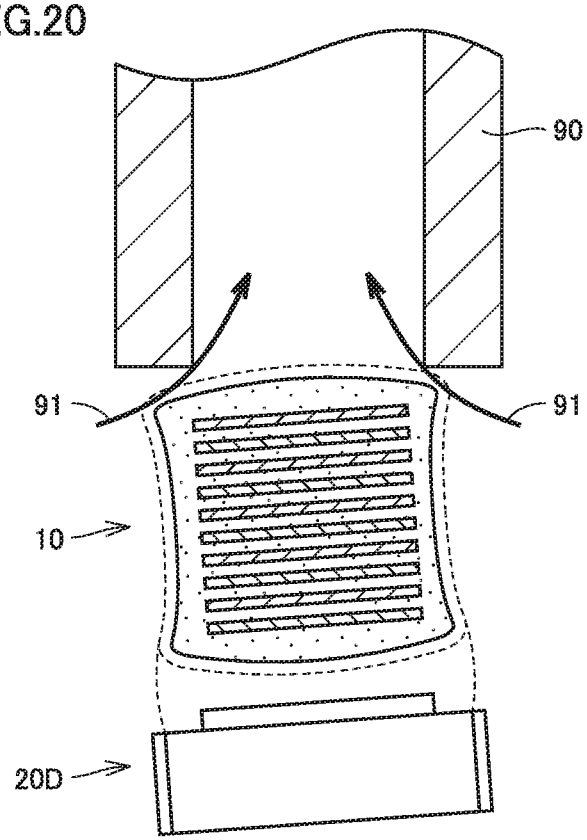
FIG. 20 is a cross-sectional view showing a state in which a composite electronic component in which the direction in which internal electrode layers are stacked is parallel or substantially parallel to the height direction is sucked with a nozzle of a mounter.
Figure 21:
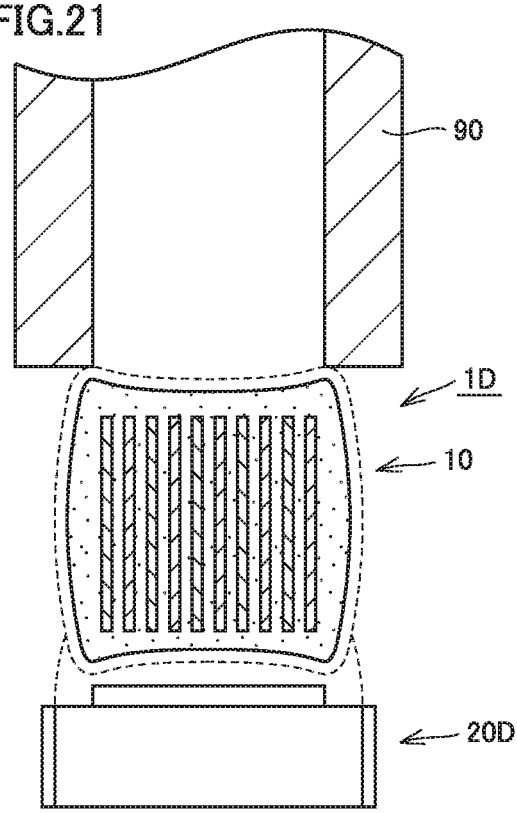
FIG. 21 is a cross-sectional view showing a state in which a composite electronic component in the present preferred embodiment in which the direction in which internal electrode layers are stacked is perpendicular or substantially perpendicular to the height direction is sucked with a nozzle of a mounter.

A step of mounting the composite electronic component on a circuit board by sucking the composite electronic component with a mounter is described. FIG. 20 is a cross-sectional view showing a state in which a composite electronic component in which the direction in which internal electrode layers are stacked is parallel or substantially parallel to the height direction is sucked with a nozzle of a mounter. FIG. 21 is a cross-sectional view showing a state in which a composite electronic component in the present preferred embodiment in which the direction in which internal electrode layers are stacked is perpendicular or substantially perpendicular to the height direction is sucked with a nozzle of a mounter.

As shown in FIG. 20, in the case where a plurality of internal electrode layers 13 of capacitor device 10 are stacked in the direction parallel or substantially parallel to the height direction H and accordingly each of the pair of main surfaces of capacitor body 11 is curved so that its center in width direction W is protruded outward in height direction H relative to its ends in width direction W, a gap is likely to be generated between the forward end of a nozzle 90 of the mounter and the main surface of capacitor body 11. Through this gap, air passes as indicated by an arrow 91, resulting in a decrease of the suction force of the mounter. If the mounter is moved in this state, the acceleration applied by operation of the mounter may cause the composite electronic component to swing and the composite electronic component in an inclined state may be held by the mounter as shown in FIG. 20. If the composite electronic component held in such a state is mounted on a circuit board, the precision with which the composite electronic component is positioned with respect to the circuit board is reduced and the obliquely inclined composite electronic component is mounted on the circuit board.

This phenomenon may also occur when capacitor device 10 is mounted on resistor device 20D. If this phenomenon occurs when capacitor device 10 is mounted on resistor device 20D, the precision with which capacitor device 10 is positioned with respect to resistor device 20D is reduced and obliquely inclined capacitor device 10 is mounted on resistor device 20D.

In composite electronic component 1D in the present preferred embodiment, the direction in which a plurality of internal electrode layers 13 of capacitor device 10A are stacked is perpendicular or substantially perpendicular to height direction H, and therefore, each of the pair of main surfaces of capacitor body 11 is curved so that its ends in width direction W protrude outward in height direction H relative to its center in width direction W. In this case, the forward end of nozzle 90 of the mounter is easily brought into close contact with the main surface of capacitor body 11. Therefore, a high suction force of the mounter is stably maintained and the composite electronic component is held in a stable posture without being inclined. When composite electronic component 1D is mounted on a circuit board, composite electronic component 1D is positioned with respect to the circuit board with high precision and composite electronic component 1D is mounted on the circuit board in a stable posture without being inclined.

Similarly, regarding composite electronic component 1D in the present preferred embodiment, when capacitor device 10A is mounted on resistor device 20D, capacitor device 10A is positioned with respect to resistor device 20D with high precision and capacitor device 10A is mounted on resistor device 20D in a stable posture without being inclined.

Regarding composite electronic component 1D in the present preferred embodiment, the melting point of a conductive joint material used for each of first and second joint members 31 and 32 is preferably higher than the melting point of a solder used to mount composite electronic component 1D on a circuit board. Therefore, when composite electronic component 1D is mounted on the circuit board, each of first and second joint members 31 and is less likely to be re-melted. Consequently, positional displacement of resistor device 20D and capacitor device 10A relative to each other is less likely to occur, and a short circuit between composite electronic component 1D and an electronic component disposed in the vicinity of composite electronic component 1D is reduced or prevented. Moreover, occurrence of solder flash is reduced or prevented.

Solder flash is a phenomenon as follows. When elements joined together by a solder are sealed by a resin and the solder is heated again to a temperature of its melting point or higher, the solder is melted to expand and accordingly extend along the interface between the resin and the elements while breaking the interface.

In composite electronic component 1D in the present preferred embodiment, first upper surface conductor 24A is not in direct contact with first external electrode 14A and second upper surface conductor 24B is not in direct contact with second external electrode 14B. An adequate thickness of each of first and second joint members 31 and 32 is thus ensured. Consequently, in each of first and second joint members 31 and 32, the occurrence of voids in the conductive joint material is reduced or prevented and an adequate joint strength between resistor device 20D and capacitor device 10A is stably provided.

Between lower surface 11a of capacitor body 11 and resistor device 20D, an adequate space in height direction H is provided. This enables a cleaning fluid to easily enter the space between lower surface 11a of capacitor body 11 and resistor device 20D and reliably remove flux residue. When a visual inspection of the joint between resistor device 20D and capacitor device 10A is conducted, the space in height direction H between lower surface 11a of capacitor body 11 and resistor device 20D facilitates visual recognition and evaluation of the joint between first upper surface conductor 24A and first external electrode 14A and the joint between second upper surface conductor 24B and second external electrode 14B.

Fourth Preferred Embodiment

A composite electronic component in a fourth preferred embodiment of the present invention is described below. A composite electronic component 1E in the present preferred embodiment differs from composite electronic component 1D in the third preferred embodiment in terms of the configuration of the first and second external electrodes as well as a resin film disposed on the surface of the first and second joint members. Features similar to those of composite electronic component 1D in the third preferred embodiment are therefore not repeated.

Figure 22:
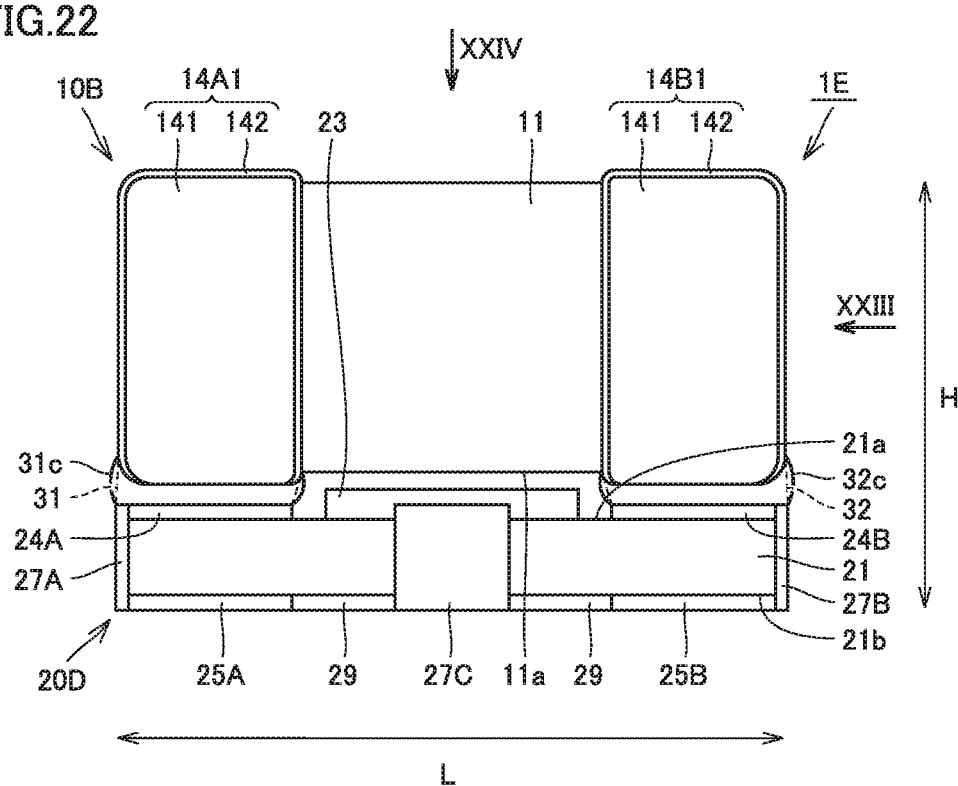
FIG. 22 is a side view of a composite electronic component in a fourth preferred embodiment of the present invention.
Figure 23:
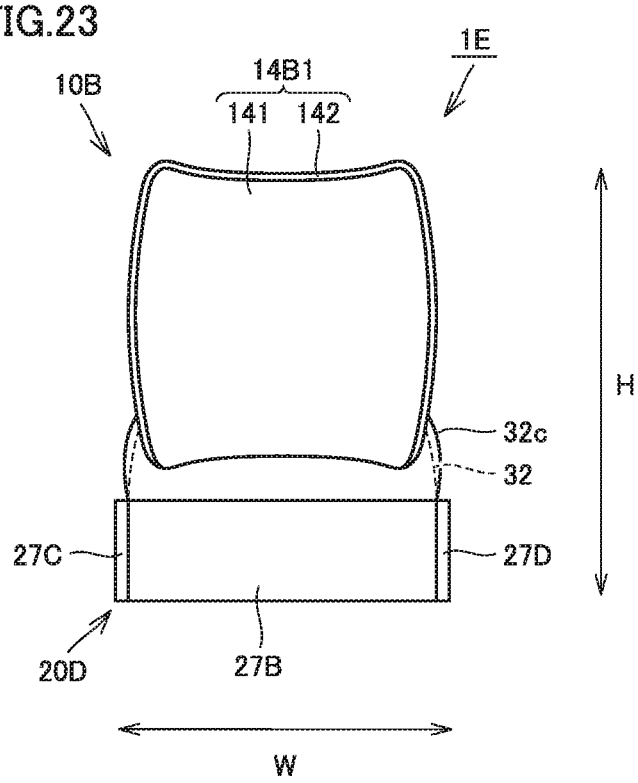
FIG. 23 is a diagram of the composite electronic component in FIG. 22 as seen in the direction of an arrow XXIII.
Figure 24:
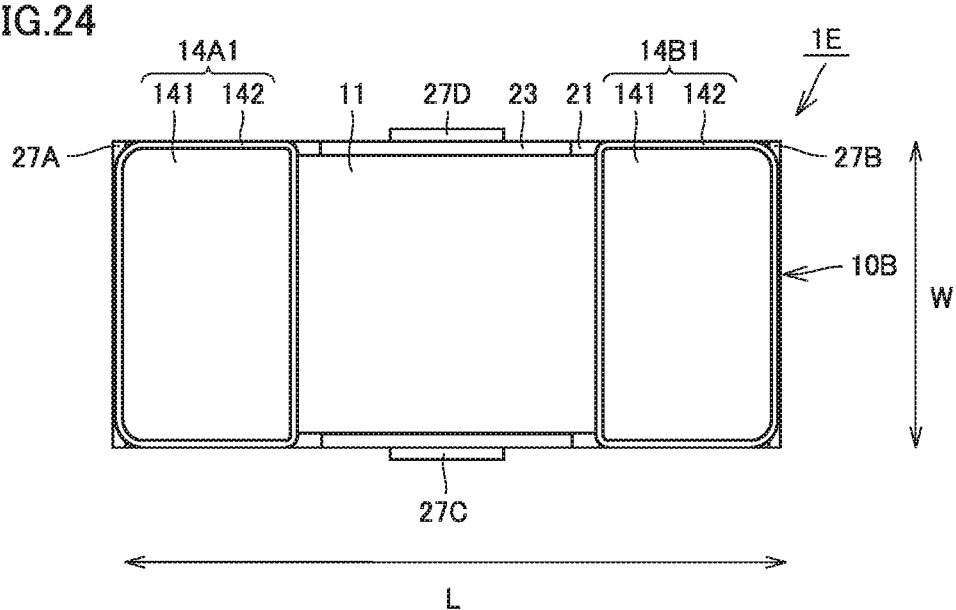
FIG. 24 is a diagram of the composite electronic component in FIG. 22 as seen in the direction of an arrow XXIV.

FIG. 22 is a side view of a composite electronic component in the fourth preferred embodiment of the present invention. FIG. 23 is a diagram of the composite electronic component in FIG. 22 as seen in the direction of an arrow XXIII. FIG. 24 is a diagram of the composite electronic component in FIG. 22 as seen in the direction of an arrow XXIV.

As shown in FIGS. 22 to 24, composite electronic component 1E in the fourth preferred embodiment of the present invention includes a capacitor device 10B and a resistor device 20D. A first external electrode 14A1 and a second external electrode 14B1 of capacitor device 10B each preferably includes an Sn (tin) plating layer 141 and an Sn—Ni (nickel) layer 142 covered by Sn plating layer 141 and containing an intermetallic compound of Sn and Ni, for example.

Specifically, first external electrode 14A1 and second external electrode 14B1 each preferably includes, in order from the outer one, Sn plating layer 141, Sn—NI layer 142, and an Ni plating layer (not shown), for example. Sn—Ni layer 142 is formed preferably by alloying of Sn in Sn plating layer 141 and Ni in the Ni plating layer Ni.

Sn—Ni layer 142 is exposed from at least a portion of each of first external electrode 14A1 and second external electrode 14B1. In the present preferred embodiment, Sn—Ni layer 142 is exposed from the vertices and edges of each of first external electrode 14A1 and second external electrode 14B1. On the exposed surface of Sn—Ni layer 142, an oxide coating is formed due to contact with the air. The oxide coating on Sn—Ni layer 142 has a property that makes the material forming first joint member 31 and second joint member 32 less likely to adhere to the oxide film and has electrical insulation property.

As to the method for exposing Sn—Ni layer 142, the portions of first and second external electrodes 14A1 and 14A2 in which Sn—Ni layer 142 is not to be exposed are masked. Masked capacitor device 10B is immersed in a stripping solution. As the stripping solution, ENSTRIP® that selectively dissolves Sn may preferably be used, for example.

The portion of each of first and second external electrodes 14A1 and 14B1 in which Sn—Ni layer 142 is exposed is not limited to the vertices and edges, and the entirety of the portion covering the side surfaces and the top surface of capacitor body 11 may include an exposed Sn—Ni layer 142, for example. In this case, Sn plating layer 141 is located in only the surface of the portion of each of first and second external electrodes 14A1 and 14B1 that covers lower surface 11a of capacitor body 11.

In composite electronic component 1E in the fourth preferred embodiment of the present invention, resin films 31c and 32c each extending continuously on capacitor device 10B and resistor device 20D cover at least a portion of the surfaces of first and second joint members 31 and 32. In the present preferred embodiment, resin film 31c covers the entire or substantially the entire surface of first joint member 31, and resin film 32c covers the entire or substantially the entire surface of second joint member 32. Resin films 31c and 32c may fill a gap between capacitor device 10B and resistor device 20D.

Resin films 31c and 32c are each preferable made of epoxy resin, urethane resin, or other suitable resin containing hardener and/or inorganic filler, for example. The heat-proof temperature of resin films 31c and 32c is preferably higher than the melting point of the material forming first and second joint members 31 and 32.

When capacitor device 10B is joined to resistor device 20D, Sn melted from Sn plating layer 141 flows onto the end surfaces of capacitor body 11 due to surface tension, causing a phenomenon of increasing the length of capacitor device 10B. In composite electronic component 1E in the fourth preferred embodiment, Sn plating layer 141 is partially removed from each of first and second external electrodes 14A1 and 14B1, which makes it less likely that the phenomenon of increasing the length of capacitor device 10B occurs.

Sn—Ni layer 142 is preferably exposed from the vertices and edges of each of first and second external electrodes 14A1 and 14B1, and therefore, even when at least one of first and second external electrodes 14A1 and 14B1 of composite electronic component 1E is brought into contact with an adjacent electronic component, at the position where Sn—Ni layer 142 is exposed, the electrical insulation property of Sn—Ni layer 142 reduces or prevents a short circuit between this electronic component and composite electronic component 1E.

Regarding composite electronic component 1E in the fourth preferred embodiment, the phenomenon of increasing the length of capacitor device 10B is less likely to occur and the occurrence of a short circuit between composite electronic component 1E and an adjacent electronic component is reduced or prevented as described above, which enables electronic components to be integrated on a circuit board at a high density.

In composite electronic component 1E in the fourth preferred embodiment, resin films 31c and 32c extending continuously on capacitor device 10B and resistor device 20D are disposed on first and second joint members 31 and 32. Accordingly, the area of the joint between capacitor device 10B and resistor device 20D is increased, and consequently, the strength of the joint between capacitor device 10B and resistor device 20D is increased.

The heatproof temperature of resin films 31c and 32c is higher than the melting point of the material forming first and second joint members 31 and 32. Therefore, when composite electronic component 1E is mounted on a circuit board and first and second joint members 31 and 32 are each re-melted, positional displacement of resistor device 20D and capacitor device 10B relative to each other is less likely to occur.

In the present preferred embodiment, resin film 31c preferably covers the entire or substantially the entire surface of first joint member 31 and resin film 32c covers the whole surface of second joint member 32. Therefore, when first and second joint members 31 and 32 are each made of a solder, flow of the re-melted solder is blocked by resin films 31c and 32c and the occurrence of solder flash is reduced or prevented.

Fifth Preferred Embodiment

A composite electronic component in a fifth preferred embodiment of the present invention is described below. A composite electronic component 1F in the present preferred embodiment differs from composite electronic component 1D in the third preferred embodiment in that the width of first and second external electrodes is smaller than the width of the capacitor body. Features similar to those of composite electronic component 1D in the third preferred embodiment are therefore not repeated.

Figure 25:
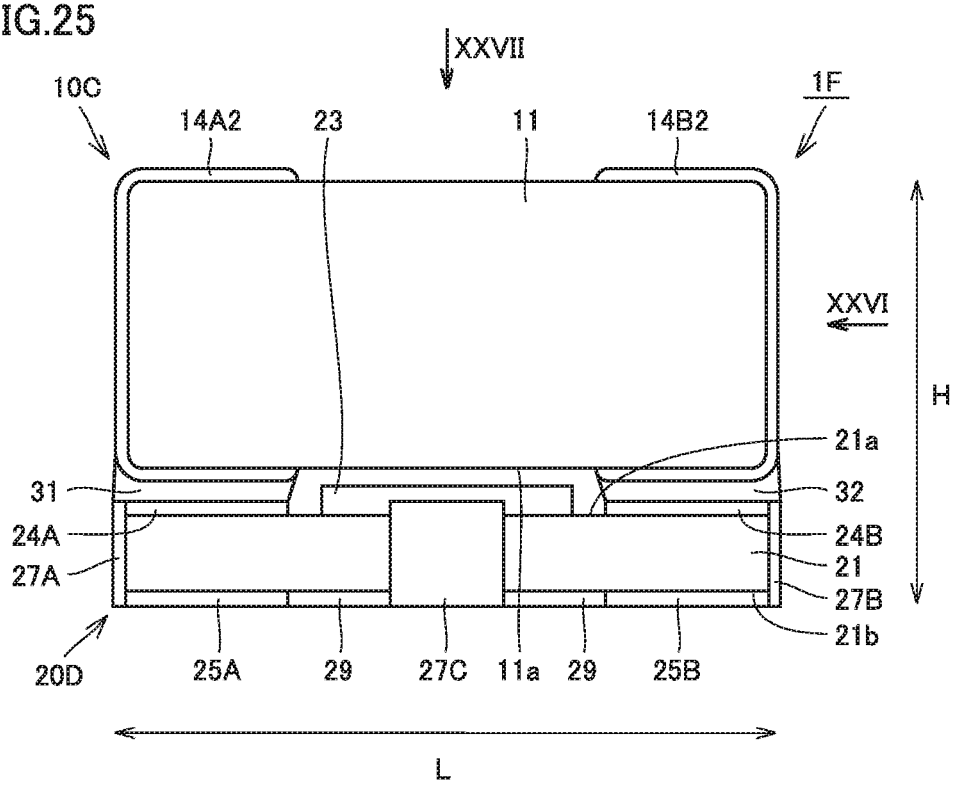
FIG. 25 is a side view of a composite electronic component in a fifth preferred embodiment of the present invention.
Figure 26:
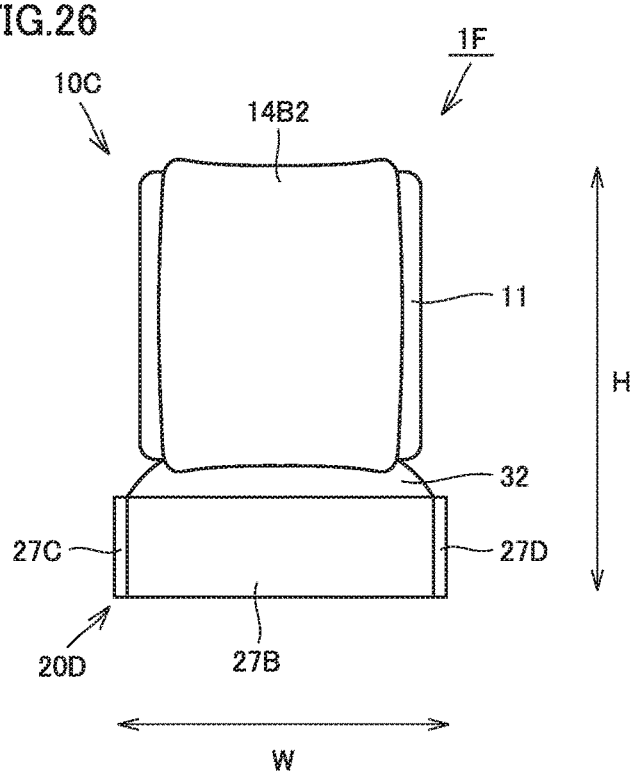
FIG. 26 is a diagram of the composite electronic component in FIG. 25 as seen in the direction of an arrow XXVI.
Figure 27:
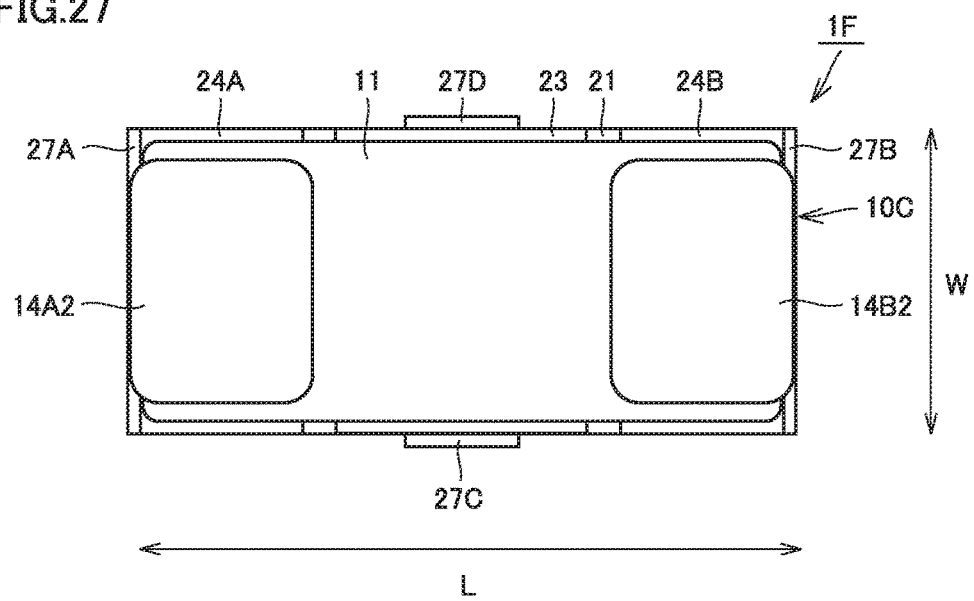
FIG. 27 is a diagram of the composite electronic component in FIG. 25 as seen in the direction of an arrow XXVII.

FIG. 25 is a side view of a composite electronic component in the fifth preferred embodiment of the present invention. FIG. 26 is a diagram of the composite electronic component in FIG. 25 as seen in the direction of an arrow XXVI. FIG. 27 is a diagram of the composite electronic component in FIG. 25 as seen in the direction of an arrow XXVII.

As shown in FIGS. 25 to 27, composite electronic component 1F in the fifth preferred embodiment includes a capacitor device 10C and a resistor device 20D. The width of each of first and second external electrodes 14A2 and 14B2 of capacitor device 10C is preferably smaller than the width of capacitor body 11.

First external electrode 14A2 is disposed continuously on one end surface of capacitor body 11 and a portion of each of the pair of main surfaces of capacitor body 11. Second external electrode 14B2 is disposed continuously on the other end surface of capacitor body 11 and a portion of each of the pair of main surfaces of capacitor body 11. The manner of disposing first and second external electrodes 14A2 and 14B2, however, is not limited to this. First external electrode 14A2 may be disposed continuously on one end surface and a portion of lower surface 11a of capacitor body 11, or disposed on only a portion of lower surface 11a. Second external electrode 14B2 may be disposed continuously on the other end surface and a portion of lower surface 11a of capacitor body 11, or disposed on only a portion of lower surface 11a.

Regarding composite electronic component 1F in the fifth preferred embodiment, the width of each of first and second external electrodes 14A2 and 14B2 is preferably smaller than the width of capacitor body 11. Therefore, even when composite electronic component 1F is brought into contact with an adjacent electronic component, at the position of the side surface of capacitor body 11 where first and second external electrodes 14A2 and 14B2 of capacitor device 10C are absent, a short circuit between the electronic component and composite electronic component 1F is prevented.

As to the composite electronic components in the first to fifth preferred embodiments, the width of the resistor device may be larger than the width of the capacitor device. The length of the resistor device may be larger than the length of the capacitor device.

Figure 28:
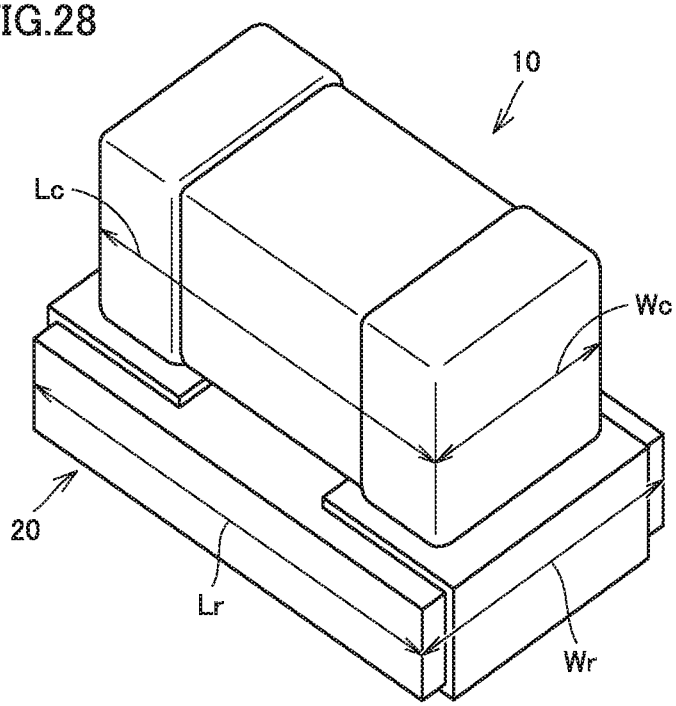
FIG. 28 is a perspective view showing a composite electronic component in which a resistor device is larger in width than a capacitor device and larger in length than the capacitor device.
Figure 29:
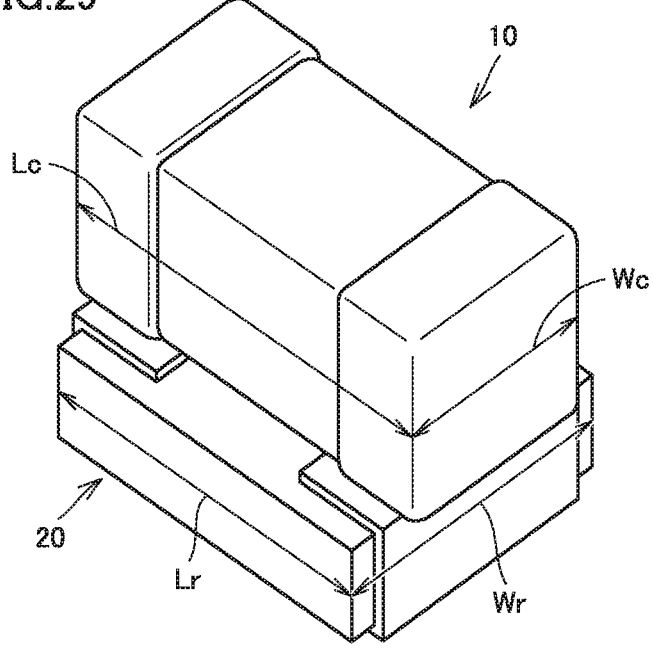
FIG. 29 is a perspective view showing a composite electronic component in which a resistor device is larger in width than a capacitor device and smaller in length than the capacitor device.

FIG. 28 is a perspective view showing a composite electronic component in which a resistor device is larger in width than a capacitor device and larger in length than the capacitor device. FIG. 29 is a perspective view showing a composite electronic component in which a resistor device is larger in width than a capacitor device and smaller in length than the capacitor device.

As to the composite electronic components in the first to fifth preferred embodiments, width Wr of resistor device 20 may be larger than width Wc of capacitor device 10 and length Lr of resistor device 20 may be larger than length Lc of capacitor device 10, as shown in FIG. 28. Alternatively, as to the composite electronic components in the first to fifth preferred embodiments, width Wr of resistor device 20 may be larger than width Wc of capacitor device 10 and length Lr of resistor device 20 may be smaller than length Lc of capacitor device 10, as shown in FIG. 29.

Figure 30:
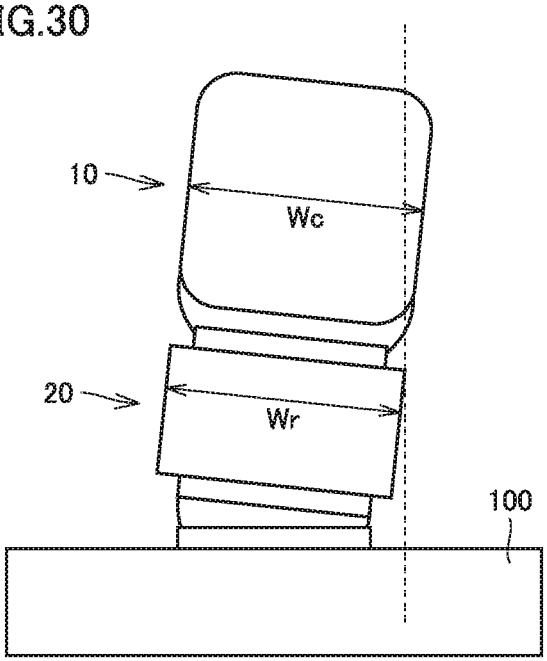
FIG. 30 is a side view showing a state where a composite electronic component in which a resistor device is equal in width to a capacitor device is mounted in an inclined posture on a circuit board.
Figure 31:
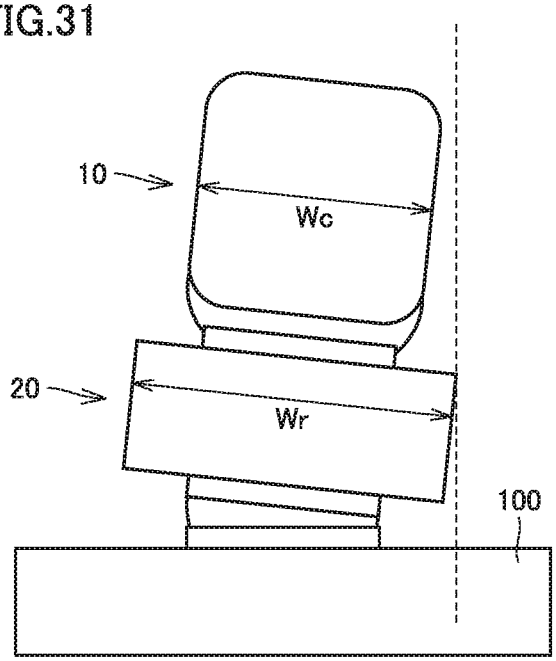
FIG. 31 is a side view showing a state where a composite electronic component in which a resistor device is larger in width than a capacitor device is mounted in an inclined posture on a circuit board.

FIG. 30 is a side view showing a state in which a composite electronic component in which a resistor device is equal in width to a capacitor device is mounted in an inclined posture on a circuit board. FIG. 31 is a side view showing a state in which a composite electronic component in which a resistor device is larger in width than a capacitor device is mounted in an inclined posture on a circuit board.

As shown in FIG. 30, when width Wr of resistor device 20 is equal to or less than width Wc of capacitor device 10 and the composite electronic component is mounted in an inclined posture on circuit board 100 as seen in length direction L, capacitor device 10 is partially located outside the region in width direction W in which resistor device 20 is located. Then, there is a possibility that an adjacently disposed electronic component and capacitor device 10 are brought into contact with each other and short-circuited.

As shown in FIG. 31, when width Wr of resistor device 20 is larger than width Wc of capacitor device 10 and the composite electronic component is mounted in an inclined posture on circuit board 100 as seen in length direction L, capacitor device 10 is less likely to be located outside the region in width direction W in which resistor device 20 is located. Thus, the possibility that an adjacently disposed electronic component and capacitor device 10 are brought into contact with each other and short-circuited is reduced.

Likewise, when length Lr of resistor device 20 is equal to or less than length Lc of capacitor device 10 and the composite electronic component is mounted in an inclined posture on circuit board 100 as seen in width direction W, capacitor device 10 is partially located outside the region in length direction L in which resistor device 20 is located. Thus, there is a possibility that an adjacently disposed electronic component and capacitor device 10 are brought into contact with each other and short-circuited.

When length Lr of resistor device 20 is larger than length Lc of capacitor device 10 and the composite electronic component is mounted in an inclined posture on circuit board 100 as seen in width direction W, capacitor device 10 is less likely to be located outside the region in length direction L in which resistor device 20 is located. Thus, the possibility that an adjacently disposed electronic component and capacitor device 10 are brought into contact with each other and short-circuited is reduced.

Thus, width Wr of resistor device 20 larger than width Wc of capacitor device 10 or length Lr of resistor device 20 larger than length Lc of capacitor device 10 enables a reduction of the distance between electronic components mounted on circuit board 100 and, therefore, enables downsizing of circuit board 100.

Regarding the preferred embodiments and their modifications of the present invention, use of a multilayer ceramic capacitor as a capacitor device to be included in the composite electronic component is described by way of example. Alternatively, any of other types of capacitor devices may be included in the composite electronic component, instead of the multilayer ceramic capacitor.

Moreover, regarding the preferred embodiments and their modifications of the present invention, use of a multilayer ceramic capacitor as an electronic component to be mounted on the resistor device is described by way of example. The electronic component to be mounted on the resistor device may be any capacitor device other than the multilayer ceramic capacitor, and may be any of other electronic components, such as an inductor device, a thermistor device, a piezoelectric device, and other suitable devices. The inductor device as compared to the multilayer ceramic capacitor includes a coil-shaped conductor layer instead of the internal electrode layer and a pair of external terminals for the coil-shaped conductor layer are disposed on the surface of the body instead of the pair of external electrodes.

Further, respective characteristic features illustrated in connection with the preferred embodiments and their modifications of the present invention may be combined in any way without going beyond the intended scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite electronic component comprising:
    a resistor device; and
    a capacitor device mounted on the resistor device in a height direction; wherein
    the resistor device includes:
        an electrically insulating base including an upper surface and a lower surface opposite to each other in the height direction;
        a resistive element disposed on the base;
        a first upper surface conductor and a second upper surface conductor disposed on the upper surface of the base and separated from each other in a length direction perpendicular or substantially perpendicular to the height direction;
        a first lower surface conductor and a second lower surface conductor disposed on the lower surface of the base and separated from each other in the length direction;
        a first connection conductor connecting the first upper surface conductor to the first lower surface conductor; and
        a second connection conductor connecting the second upper surface conductor to the second lower surface conductor;
    the capacitor device includes:
        a capacitor body including a lower surface crossing the height direction; and
        a first external electrode and a second external electrode disposed on an outer surface of the capacitor body and separated from each other in the length direction;
    the upper surface of the base faces the lower surface of the capacitor body in the height direction, the first upper surface conductor is electrically connected to the first external electrode, and the second upper surface conductor is electrically connected to the second external electrode; and
    the first connection conductor and the second connection conductor are each defined by only a conductor located on an outer peripheral surface of the base.

2. The composite electronic component according to claim 1, wherein
    the resistive element is disposed on the upper surface of the base and located between the first upper surface conductor and the second upper surface conductor in the length direction;
    the resistor device further includes:
        a third upper surface conductor and a fourth upper surface conductor disposed on the upper surface of the base, located between the first upper surface conductor and the second upper surface conductor in the length direction, and separated from each other;
        a third lower surface conductor and a fourth lower surface conductor disposed on the lower surface of the base, located between the first lower surface conductor and the second lower surface conductor in the length direction, and separated from each other;
        a third connection conductor connecting the third upper surface conductor to the third lower surface conductor; and
        a fourth connection conductor connecting the fourth upper surface conductor to the fourth lower surface conductor;
    the third upper surface conductor and the fourth upper surface conductor are connected to the resistive element; and
    the third connection conductor and the fourth connection conductor are each defined by only a conductor located on the outer peripheral surface of the base.

3. The composite electronic component according to claim 2, wherein the third upper surface conductor and the fourth upper surface conductor are separated from each other in a width direction perpendicular or substantially perpendicular to the height direction and to the length direction.

4. The composite electronic component according to claim 2, wherein the resistor device further includes a protective film covering the resistive element.

5. The composite electronic component according to claim 4, wherein a maximum height of the protective film from the upper surface of the base is larger than respective maximum heights of the first upper surface conductor and the second upper surface conductor from the upper surface of the base.

6. The composite electronic component according to claim 1, wherein
    the resistive element is disposed on the upper surface of the base; and
    the first upper surface conductor and the second upper surface conductor are connected to the resistive element.

7. The composite electronic component according to claim 1, wherein the resistive element is disposed on the lower surface of the base and located between the first lower surface conductor and the second lower surface conductor in the length direction;

the resistor device further includes a third lower surface conductor and a fourth lower surface conductor disposed on the lower surface of the base, located between the first lower surface conductor and the second lower surface conductor in the length direction, and separated from each other; and the third lower surface conductor and the fourth lower surface conductor are connected to the resistive element.

8. The composite electronic component according to claim 7, wherein the third lower surface conductor and the fourth lower surface conductor are separated from each other in a width direction perpendicular or substantially perpendicular to the height direction and to the length direction.

9. The composite electronic component according to claim 7, wherein the resistor device further includes a protective film covering the resistive element.

10. The composite electronic component according to claim 1, wherein the capacitor body includes a plurality of internal electrode layers that are stacked;

one of a pair of internal electrode layers adjacent to each other among the plurality of internal electrode layers is electrically connected to one of the first external electrode and the second external electrode and another of the pair of internal electrode layers is electrically connected to another of the first external electrode and the second external electrode; and a direction in which the plurality of internal electrode layers are stacked together is perpendicular or substantially perpendicular to the height direction.

11. The composite electronic component according to claim 1, wherein the first upper surface conductor and the first external electrode are connected to each other through a first joint member;

the second upper surface conductor and the second external electrode are connected to each other through a second joint member; and the first joint member and the second joint member are each made of a conductive joint material.

12. The composite electronic component according to claim 11, wherein the conductive joint material contains Sn and Sb or contains Sn and Au.

13. The composite electronic component according to claim 11, wherein Ag and Cu are absent from the conductive joint material.

14. The composite electronic component according to claim 11, wherein the conductive joint material has a melting point of about 237° C. or more.

15. The composite electronic component according to claim 11, wherein a resin film extending continuously on the capacitor device and the resistor device covers at least a portion of a surface of each of the first joint member and the second joint member.

16. The composite electronic component according to claim 15, wherein the resin film covers an entire surface of each of the first joint member and the second joint member.

17. The composite electronic component according to claim 1, wherein the first external electrode and the second external electrode each include an Sn plating layer and an Sn—Ni layer covered by the Sn plating layer and including an intermetallic compound of Sn and Ni; and the Sn—Ni layer is exposed from at least a portion of each of the first external electrode and the second external electrode.

18. The composite electronic component according to claim 17, wherein the Sn—Ni layer is exposed from vertices and edges of each of the first external electrode and the second external electrode.

19. The composite electronic component according to claim 1, wherein the first external electrode and the second external electrode are each smaller in width than the capacitor body.

20. The composite electronic component according to claim 1, wherein the resistor device is larger in width than the capacitor device.

* * * * *